(12) United States Patent
Legein et al.

(10) Patent No.: US 10,410,833 B2
(45) Date of Patent: Sep. 10, 2019

(54) WAYS TO GENERATE PLASMA IN CONTINUOUS POWER MODE FOR LOW PRESSURE PLASMA PROCESSES

(71) Applicant: Europlasma NV, Oudenaarde (BE)

(72) Inventors: Filip Legein, Oudenaarde (BE); Eva Rogge, Oudenaarde (BE); Marc Sercu, Oudenaarde (BE)

(73) Assignee: Europlasma NV, Oudenaarde (BE)

( * ) Notice: Subject to any disclaimer, the term of this patent is extended or adjusted under 35 U.S.C. 154(b) by 448 days.

(21) Appl. No.: 15/027,708

(22) PCT Filed: Oct. 7, 2014

(86) PCT No.: PCT/EP2014/071466
§ 371 (c)(1),
(2) Date: Apr. 7, 2016

(87) PCT Pub. No.: WO2015/052199
PCT Pub. Date: Apr. 16, 2015

(65) Prior Publication Data
US 2016/0284518 A1    Sep. 29, 2016

(30) Foreign Application Priority Data
Jul. 10, 2013 (EP) .................................. 13187623

(51) Int. Cl.
*H01J 37/32* (2006.01)
*B05D 7/02* (2006.01)
(Continued)

(52) U.S. Cl.
CPC .......... *H01J 37/32146* (2013.01); *B05D 5/08* (2013.01); *B05D 7/02* (2013.01);
(Continued)

(58) Field of Classification Search
None
See application file for complete search history.

(56) References Cited

U.S. PATENT DOCUMENTS

| 5,355,832 A | 10/1994 | Loh |
| 9,816,226 B2* | 11/2017 | Legein ................. D06B 19/007 |

(Continued)

FOREIGN PATENT DOCUMENTS

| EP | 0049884 A1 | 4/1982 |
| WO | 03082483 A1 | 10/2003 |

(Continued)

OTHER PUBLICATIONS

Yasuda and Hsu; Journal of Polymer Science, vol. 15, pp. 81-97 and pp. 2411-2425.

*Primary Examiner* — John J Figueroa
(74) *Attorney, Agent, or Firm* — James Creighton Wray

(57) ABSTRACT

The present invention concerns a method comprising the steps of: introducing a substrate comprising a surface to be coated in a low-pressure reaction chamber; exposing said surface to a plasma during a treatment period within said reaction chamber; ensuring a stable plasma ignition by applying a power input, characterized in that the power input is continuously strictly higher than zero Watt (W) during said treatment period and comprises at least a lower limit power and at least an upper limit power strictly larger than said lower limit power, thereby obtaining a substrate with a coated surface. The present invention further concerns an apparatus for treating a substrate with a low-pressure plasma process and a substrate treated as such.

13 Claims, 10 Drawing Sheets

(51) Int. Cl.
- *B05D 5/08* (2006.01)
- *C03C 17/32* (2006.01)
- *C23C 16/50* (2006.01)
- *B05D 7/14* (2006.01)
- *C04B 41/00* (2006.01)
- *C04B 41/45* (2006.01)
- *C04B 41/83* (2006.01)
- *C09D 133/16* (2006.01)
- *C23C 26/00* (2006.01)
- *D21H 23/22* (2006.01)
- *B05D 1/00* (2006.01)

(52) U.S. Cl.
CPC ............ *B05D 7/14* (2013.01); *C03C 17/32* (2013.01); *C04B 41/009* (2013.01); *C04B 41/4523* (2013.01); *C04B 41/83* (2013.01); *C09D 133/16* (2013.01); *C23C 16/50* (2013.01); *C23C 26/00* (2013.01); *D21H 23/22* (2013.01); *B05D 1/62* (2013.01); *C03C 2217/20* (2013.01); *C03C 2217/76* (2013.01); *C03C 2218/15* (2013.01); *H01J 2237/327* (2013.01); *H01J 2237/3326* (2013.01)

(56) References Cited

U.S. PATENT DOCUMENTS

| | | | |
|---|---|---|---|
| 2010/0248489 A1* | 9/2010 | Koguchi | H01J 37/32091 438/714 |
| 2012/0051018 A1* | 3/2012 | Ollgaard | B05D 1/62 361/781 |
| 2012/0080408 A1 | 4/2012 | Ui | |
| 2012/0107901 A1 | 5/2012 | Cahalan | |
| 2014/0305589 A1 | 10/2014 | Valcore | |
| 2014/0322525 A1* | 10/2014 | Legein | C08F 2/52 428/336 |
| 2015/0232688 A1* | 8/2015 | Legein | C09D 5/24 428/336 |

FOREIGN PATENT DOCUMENTS

| | | |
|---|---|---|
| WO | 2004067614 A1 | 8/2004 |
| WO | 2011156813 A1 | 12/2011 |

\* cited by examiner

WAYS TO GENERATE PLASMA IN CONTINUOUS POWER MODE FOR LOW PRESSURE PLASMA PROCESSES

This application claims the benefit of European Application No. 13187623.7 filed Oct. 7, 2013 and PCT/EP2014/071466 filed Oct. 7, 2014, International Publication No. WO 2015/052199 A1, which are hereby incorporated by reference in their entirety as if fully set forth herein.

TECHNICAL FIELD

The present invention is to be situated in the technical field of plasma coating of substrates, in particular whereby the plasma coating is performed in continuous power mode and at low pressure.

BACKGROUND OF THE INVENTION

Low pressure plasma processing is a known technique developed since the early '80 for the cleaning and activation of small components in electronics. Since then, the technique has been evolved continuously and new processes and new applications have been developed.

One of these new processes is the deposition of coatings onto surfaces to add functions to the substrates, such as better wettability, scratch resistance, liquid repellency, and many more. Examples of surfaces which can be coated using plasma coating deposition include polymers, textile and fabrics, metals and alloys, paper, composites, ceramics, as well as specific products made of these materials or a combination thereof.

For example, Yasuda describes the use of hydrocarbons and perfluorocarbons to deposit water repellent coatings by means of plasma processes (Journal of Polymer Science, vol. 15, pp 81-97 and pp 2411-2425 (1977).

EP0049884 describes a process to deposit fluoroalkyl acrylate polymers on a substrate, using low pressure plasma polymerization of precursor monomers.

WO2004067614 describes a method to deposit a liquid repellent coating on an open cell structure, wherein the coating is deposited throughout the whole structure so as to coat not only the outer surface, but the internal surfaces as well.

US2012107901 describes a four-step process to obtain medical devices with better biomolecule adhesion.

As is known from prior art, low pressure plasma processes can be performed in a closed environment under reduced pressure. In their most simplified way, such processes include the following 5 steps:

Evacuation of the chamber to reach low pressure;
Introduction of reaction gas or gases;
Generation of an electromagnetic field inside the plasma chamber to create a beneficial plasma;
Turning off the plasma generation after a sufficient period of time; and
Venting the chamber until atmospheric pressure is reached, after which the treated substrates can be taken out of the chamber.

Plasma is formed when an electromagnetic field is generated inside the plasma chamber. This is done by application of a power to the electromagnetic field generation device. In a capacitive plasma equipment, electrodes are mounted inside the plasma chamber. Some electrodes are ground, and the power is applied onto the other electrodes, for example radio frequency electrodes. In an inductive plasma equipment, an conductive coil is wound around the plasma chamber, and the power is applied thereon.

Prior art describes two ways of applying power to generate the plasma, which can be used for both capacitive and inductive equipment. A first way is using continuous wave plasma, wherein the power is set at a certain value substantially higher than 0 W, and wherein this constant power value is maintained continuously during the total processing time, e.g. the power is constantly kept at 50 W during a total processing time of 10 minutes.

A second way is using a pulsed plasma mode, wherein the power is applied in a repetitive on-off sequence with short on-times and long off-times, wherein the power is bundled together in higher power peaks (on-time), so that for short on-times the power is substantially higher than 0 W. During the off-time, the power falls back to 0 W which means no power is applied during the off-times. The duration of the on-intervals and off-intervals can be varied to obtain the best process results for a given chemistry and equipment. In general very short on-times, which give sharp power peaks, combined with longer off-times lead to the best results.

In order to obtain more complex functionalities, for example liquid repellent coatings having such a low surface energy that they repel water and/or oil, or for example functionalization processes to impart long-term hydrophilic properties to a substrate, different types of precursors may be used. A lower degree of water and/or oil repellency is obtained with (often gaseous) precursors that have an easy molecular structure. For example, WO2004067614 describes the use of unsaturated and saturated perfluorocarbons, such as C2F6, C3F6, and C3F8. In the case a surface needs to be rendered hydrophilic, shorter term hydrophilicity can be obtained using gaseous precursors or mixtures thereof that have an easy composition, such as oxygen and argon. Other functionalities may also be obtained, increased or decreased, such as oleophobicity, oleophilicity, friction, stiction, cohesion properties, adhesion properties with specific materials, etc.

In those cases where the hydrophilic properties need to be maintained for a long to permanent period of time, more complex precursors (gaseous, liquid or solid) are required. When higher liquid repellency is required, for example better water and/or oil repellency, complex precursor molecules are often used. These molecules consist typically of different functional groups, for example groups for providing good bonding with the substrate and cross-linking, and groups for repellency enhancement. During processing, it is essential that the right functional groups are made reactive. For example, molecules used to impart liquid repellent properties to a substrate should be deposited in a way that keeps the functional group responsible for the repellent properties of the coating as intact as possible in order to obtain the best performing coatings.

It is known from prior art that for complex precursors the average applied power at which the low pressure plasma process takes place has to be low to keep the functional group of the precursor molecule intact, as described in for example "Pulsed Plasma Polymerisation of Perfluorocyclohexane", by Hynes et al, Macromolecules Vol 29, pp 4220-4225, 1996. The prior art method for generating a plasma as described therein, however, is not always sufficient for the continuous ignition of the plasma, because the requested low average power may be too low to maintain with commercially available generators and may prevent a good and stable ignition of the plasma.

Applicant noticed that both with a continuous wave power at a constant set power and with pulsed power mode, it is not always possible to maintain a stable ignition of the plasma. This can lead to inferior treatment or coating quality.

More in particular, if optimal functionalities are to be ensured using a continuous wave plasma, a very low value of power input is necessary. The applicant has found that such low values lead to unstable plasma ignition, in particular for plasma chambers of smaller volumes, e.g. up to about 500 l.

This problem can also occur in pulsed-plasma processes and apparatuses, as the power input is reduced to zero Watt in these set-ups for a certain off-time, which can lead to unstable plasma ignition.

Further, pulsed plasma processes suffer from the problem of low deposition or treatment rates, which can be less than 50% of the rates of corresponding continuous wave plasma processes, especially for short exposure times. Clearly, for large-scale or high-duty plasma treatment of substrates, it is important to keep the treatment or deposition rates as high as possible and the exposure time as short as possible. Therefore, pulsed plasma processes are usually not preferred for large-scale or high-duty plasma-treatment applications.

Applicant found that the above problems occur especially in smaller systems, e.g. systems with plasma chamber volumes up to 500 l, e.g. used for coating electronic components and/or devices, garments, complex shaped 3D objects, and many more.

European application EP2422887A1 in name of Oticon AS discloses a coating method for coating the surface of a device with a water and oil repellent polymer layer by exposing the surface to a compound comprising 1H, 1H, 2H, 2H-perfluorodecyl acrylate, exposing the surface to a continuous plasma having a plasma power provided by a plasma circuit, and applying a uniform polymer layer with water contact angle of more than 110°. The plasma power is reduced from an initial higher plasma power to a final lower plasma power, during exposure. The final plasma power is less than 35% of the initial higher plasma power. The coating method can be applied to a communication device such as a hearing aid. The method of EP2422887A1 can be deemed superior to plasma polymerization processes which use a pulsed plasma polymerization, because a coating layer can be deposited in a shorter treatment period due to the continuous input of power.

The present inventors have found that the method disclosed in EP2422887A1 does not lead to satisfactory results with respect to the oil- and water-repellency of the obtained coatings when applied in setups which differ from the setup described in the document. More in particular, problems were experienced when the method was applied in plasma chambers which were smaller than the plasma chamber of 100 liter cited in EP2422887A1 and/or if process times of longer than 5 minutes were needed. By applying a power input per liter of chamber volume of between 0.1 W to 0.3 W per liter, e.g. 5 W to 15 W in a chamber of 50 liter, a stable ignition of the plasma could not be obtained in small chambers during the full length of the treatment period.

A straightforward increase in power input, e.g. higher than 0.3 W per liter, could ensure a stable ignition of the plasma. However, by increasing the overall power input, the average power input also needs to be increased which results in surface coatings of inferior water- or oil-repellency, most likely caused by too many 1H, 1H, 2H, 2H-perfluorodecyl acrylate monomers being broken into smaller fragments before polymerizing to the surface.

Monomer comprising smaller fluorocarbon tails than 1H, 1H, 2H, 2H-perfluorodecyl acrylate are less prone to fragmentation. However, it is highly undesirable that the type of monomers used in a plasma polymerization coating process should depend on the chamber volume. Furthermore, in very small chambers, the power which can be applied and for which no fragmentation of the monomer occurs, can be too small to ensure a stable plasma ignition. In case the power input is increased in such very small chambers to ensure a stable plasma, also monomers with smaller tails could fragmentise in the plasma process.

As an alternative or additional solution for the problem of fragmentation, the power input profile as suggested in EP2422887A1 could be altered in that the initial period of high power input can be shortened and/or the final period of low power input can be lengthened, thereby effectively reducing the average power input. However, such a solution again leads to problems with obtaining a stable plasma ignition during the treatment period.

The present invention provides a solution for the problems with the cited prior art discussed above. Thereto, the present invention provides a coating method in which a stable plasma ignition can be ensured even for small plasma chambers, while still keeping the average power input low, thus allowing use of a wide variety of monomers, including the more complex ones containing perfluoroalkyl chains of 4 carbon atoms or more. Moreover, the present invention also provides an improvement in processing time compared to methods using a pulsed plasma.

SUMMARY OF THE INVENTION

Applicant developed various ways to apply a low average power in a continuous mode whilst the ignition of the plasma is guaranteed so as to have a stable plasma inside the chamber.

Applicant further developed various ways to apply a low average power in a continuous mode whilst the ignition of the plasma is guaranteed so as to have a stable plasma inside the chamber, said ways being largely independent of the volume of the plasma chamber, the duration of the treatment period and the types of monomers used, in particular independent from the complexity, .e.g. the length (measured in number of carbon atoms), of the monomers.

When the power is applied in continuous mode, Applicant means that the power never falls back to 0 W during the complete duration of the plasma treatment step. Only once the process is finished and the end is reached, the power is reduced to 0 W to extinct the plasma so that the chamber can be vented. The application of a minimal, non-zero power input during the total treatment period ensures that a stable plasma ignition is obtained. It should be noted here, that when the power input is reduced to zero, such as is always the case in pulsed-plasma processes, plasma ignition could be interrupted. Such interruptions may lead to undesired characteristics of the treated substrate, e.g. incomplete, thinner or uneven coating.

Therefore, the present invention concerns a method, and preferably a coating method, comprising the steps of:
  introducing a substrate comprising a surface to be treated, preferably coated, in a low-pressure reaction chamber;
  exposing said surface to a plasma during a treatment period within said reaction chamber;
  ensuring a stable plasma ignition by applying a power input,
characterized in that the power input is continuously strictly higher, and preferably substantially higher than zero Watt (W) during said treatment period and comprises at least a lower limit power, at least an upper limit power strictly larger, preferably substantially larger, than said lower limit power and optionally at least one intermediate limit power strictly larger, preferably substantially larger, than the lower limit power and strictly lower, preferably substantially lower, than the upper limit power, thereby obtaining a substrate with a treated, preferably coated, surface.

The present invention also concerns a coating method comprising the steps of:
- introducing a substrate comprising a surface to be coated in a low-pressure reaction chamber, i.e. a reaction chamber which is suited for low pressure plasma processing;
- exposing said surface to a plasma during a treatment period within said reaction chamber;
- ensuring a stable plasma ignition by applying a power input, characterized in that the power input is continuously strictly higher than zero Watt (W) during said treatment period and whereby said power input subsequently reaches a first upper limit power, a lower limit power and a second upper limit power, said first and said second upper limit power strictly larger, preferably substantially larger, than said lower limit power, thereby obtaining a substrate with a coated surface.

In an embodiment, the first upper limit power and the second upper limit power are the same. In another embodiment, the first upper limit power and the second upper limit power are substantially different from each other. Preferably, the first upper limit power is strictly larger, preferably substantially larger, than the second upper limit power. In that case, the second upper limit power may be considered to be an intermediate limit power.

In an embodiment, said first and second upper limit power, which may be equal or may be different from each other, are higher than said lower limit power by at least 0.01 Watt and/or by at least 1% of said lower limit power, preferably by at least 0.1 Watt and/or by at least 10% of said lower limit power, more preferably by at least 1 Watt and/or by at least 20% of said lower limit power. In a further aspect, the present invention concerns an apparatus, preferably a coating apparatus, comprising a reaction chamber for low-pressure treating, preferably coating, one or more surfaces of a substrate by exposing it to a plasma, plasma ignition means in said reaction chamber or in a plasma production chamber which can be brought in fluid connection with said reaction chamber and power application means for applying power to said plasma ignition means, whereby said power application means are configured to apply a power input to said plasma ignition means, whereby the power input is, preferably is arranged to be, continuously strictly, preferably substantially higher than zero W during a said treatment period and comprises at least a lower limit power, at least an upper limit power strictly larger, preferably substantially larger, than said lower limit power and optionally at least one intermediate limit power strictly larger, preferably substantially larger, than the lower limit power and strictly lower than the upper limit power.

The present invention also concerns an apparatus, preferably a coating apparatus, comprising a reaction chamber for low pressure plasma treating, preferably coating, one or more surfaces of a substrate by exposing it to a plasma, plasma ignition means in said reaction chamber or in a plasma production chamber which can be brought in fluid connection with said reaction chamber and power application means for applying power to said plasma ignition means, whereby said power application means are configured to apply a power input to said plasma ignition means, the whereby the power input is arranged to be continuously strictly higher than zero Watt (W) during said treatment period and whereby said power input subsequently reaches a first upper limit power, a lower limit power and a second upper limit power, said first and said second upper limit power strictly larger, preferably substantially larger, than said lower limit power, for obtaining a substrate with a coated surface In an embodiment, the first upper limit power and the second upper limit power are the same. In another embodiment, the first upper limit power and the second upper limit power are substantially different from each other. Preferably, the first upper limit power is strictly larger, preferably substantially larger, than the second upper limit power. In that case, the second upper limit power may be considered to be an intermediate limit power.

In an embodiment, said first and second upper limit power, which may be equal or may be different from each other, are higher than said lower limit power by at least 0.01 Watt and/or by at least 1% of said lower limit power, preferably by at least 0.1 Watt and/or by at least 10% of said lower limit power, more preferably by at least 1 Watt and/or by at least 20% of said lower limit power.

In yet a further aspect, the present invention concerns a substrate comprising one or more surfaces which are treated, preferably coated, with a method or an apparatus as specified in this description and claims.

In preferred embodiments of the invention, the power is applied in burst mode, in sinusoidal mode, in repeated burst mode, such as repeated burst mode with square shape or rectangular shape, or in triangular mode, such as regular triangular mode or irregular triangular mode, or in superpositions thereof.

Thus, the present invention concerns, but is not limited to:
1. Coating method comprising the steps of:
   introducing a substrate comprising a surface to be coated in a low-pressure reaction chamber, i.e. a reaction chamber which is suited for low pressure plasma processing;
   reducing the pressure in said reaction chamber;
   exposing said surface to a plasma during a treatment period within said reaction chamber;
   ensuring a stable plasma ignition by applying a power input,
characterized in that the power input is continuously strictly higher than zero Watt (W) during said treatment period and comprises at least a lower limit power and at least an upper limit power strictly larger than said lower limit power, thereby obtaining a substrate with a coated surface.
2. Coating method according to point 1, whereby said power input comprises at least one additional intermediate limit power, strictly larger than said lower limit power and strictly lower than said upper limit power.
3. Coating method according any of the previous points, whereby said power input is continuously strictly higher than 0.1 W, preferably strictly higher than 0.25 W, more preferably strictly higher than 0.5 W, even more preferably strictly higher than 1 W, yet more preferably strictly higher than 2 W, still more preferably strictly higher than 5 W during said treatment period, yet still more preferably strictly higher than 10 W during said treatment period.
4. Coating method according to any of the previous points, whereby said plasma comprises one or more monomers that can be polymerized by means of radical polymerization, condensation polymerization, addition polymerization, step-growth polymerization, or chain-growth polymerization, and optionally one or more carrier molecules, or a mixture thereof which comprises at least one monomer that can be polymerized.

5. Coating method according to any of the previous points, wherein the power is applied in burst mode, in sinusoidal mode, in repeated burst mode, such as repeated burst mode with square shape or rectangular shape, or in triangular mode, or in superpositions thereof.

6. Coating method according to point 5, wherein said power is applied in a superposition of at least two of the power modes comprising burst mode, sinusoidal mode, repeated burst mode and triangular mode.

7. Coating method according to any of the previous points, wherein the lower limit power is 10 to 90% of the upper limit power, preferably wherein the lower limit power is 20 to 80% of the upper limit power.

8. Coating method according to any of the previous points, wherein the power is applied in burst mode, wherein an upper limit power, substantially higher than 0 W, is applied for a period of time, after which the power is switched to a lower limit power, substantially higher than 0 W, for the remaining duration of the treatment.

9. Coating method according to points 1 to 7,
wherein the power is varied in sinusoidal mode between at least an upper limit power and at least a lower limit power, both substantially higher than 0 W, and optionally whereby the amplitude of the sinusoidally varying power is modulated;
wherein the power is applied in repeated burst mode, wherein at least a lower limit power, substantially higher than 0 W, is continuously applied and wherein the power is increased to the upper limit power or to an intermediate power at repeated time intervals, wherein the intermediate power is 20 to 95%, preferably 30 to 80% of the upper limit power; or
wherein the power is varied in triangular mode between an upper limit power, a lower limit power and optionally an intermediate power, all substantially higher than 0 W, and wherein the power is varied in a linear rate, preferably wherein the intermediate power is 20 to 95%, more preferably 30 to 80% of the upper limit power.

10. Coating method according to any of the previous points, wherein the upper limit power is each time applied for a duration between 100 ms and 5000 ms and/or wherein the lower limit power is each time applied for a duration between 500 ms and 30000 ms, and/or wherein optionally the intermediate power is each time applied for a duration between 100 ms and 5000 ms.

11. Coating method according to points 1 to 7 and points 9 to 10, wherein a power sequence of changing between upper limit power and lower limit power is repeated continuously during the treatment period.

12. Coating method according to point 11, wherein after application of the upper power limit and the lower power limit, a power sequence of changing between intermediate power and lower limit power is repeated continuously during the treatment period.

13. Coating method according to points 11 to 12, wherein the power sequence of changing between upper limit power and lower limit power followed by x times changing between intermediate power and lower limit power is repeated continuously during the total plasma process time, whereby by x is at least 1.

14. Coating apparatus comprising a reaction chamber for low-pressure plasma coating the surface of a substrate by exposing it to a plasma, plasma ignition means in said reaction chamber or in a plasma production chamber which can be brought in fluid connection with said reaction chamber and power application means for applying power to said plasma ignition means, whereby said power application means are configured to apply a power input to said plasma ignition means,
characterized in that the power input is continuously strictly higher than zero Watt (W) during said treatment period and comprises at least a lower limit power, at least an upper limit power strictly larger than said lower limit power, and optionally at least one intermediate limit power, strictly larger than said lower limit power and strictly lower than said upper limit power.

15. Substrate comprising a surface coated with a coating method according to points 1 to 13 and/or a coating apparatus according to point 14, preferably whereby said substrate comprises polymers, metal, glass, ceramics, paper or composites comprising at least two materials, which are selected from one or more of the foregoing list.

DETAILED DESCRIPTION OF THE INVENTION

Figure 1:
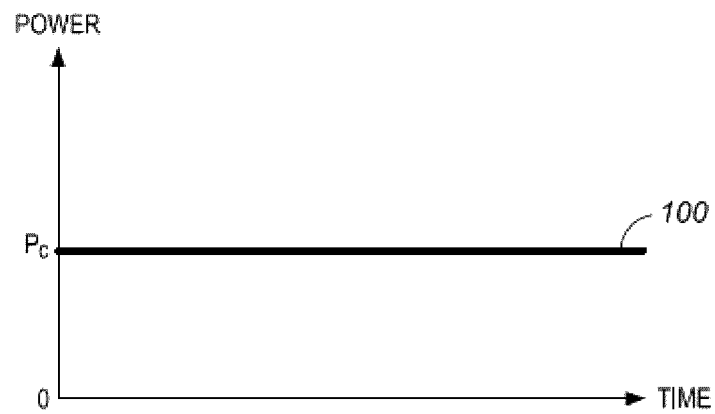
FIG. 1 shows a schematic illustration of a first power embodiment according to the prior art, in which the power is applied in a continuous wave plasma wherein the power value is kept constant over the total duration of the coating process.

As used herein, the following terms have the following meanings:

"A", "an", and "the" as used herein refers to both singular and plural referents unless the context clearly dictates otherwise. By way of example, "a compartment" refers to one or more than one compartment.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed invention. However, it is to be understood that the value to which the modifier "about" refers is itself also specifically disclosed.

"Comprise," "comprising," and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, elements, members or steps, known in the art or disclosed therein.

The recitation of numerical ranges by endpoints includes all numbers and fractions subsumed within that range, as well as the recited endpoints.

The expression "% by weight" (weight percent), here and throughout the description unless otherwise defined, refers to the relative weight of the respective component based on the overall weight of the formulation.

By the term "strictly larger" or "strictly smaller" as used herein when comparing quantities, is meant that equality is excluded, more preferably that the quantities differ by more than noise. In particular, terms "upper limit power", "lower limit power" and "intermediate limit power" as used in this description, refer to three power values which are strictly different, i.e. which differ by more than noise. In this respect, if a power input is discussed in terms of upper limit power, lower limit power and optionally intermediate limit power, the upper limit power is to be interpreted as strictly larger, preferably substantially larger, than the intermediate limit power and than the lower limit power, and the intermediate limit power is to be interpreted as strictly larger, preferably substantially larger, than the lower limit power, and as strictly lower, preferably substantially lower, than the upper limit power.

By the terms "substantially higher" or "substantially larger" in relation to a first power value, such as an applied power, a limit power, a power threshold or a given power value, when being compared with a second power value, is meant that the first power value is higher than the second power value as is clear to the person skilled in the art of plasma generation at low pressure. More preferably, the first power value could thus be higher than the second power value at least by 0.1 W, yet more preferably by 0.2 W, still more preferably by 0.5 W, even more preferably by 1 W, yet even more preferably by 2 W, still even more preferably by 5 W, yet still more preferably by 10 W. Analogously, by the terms "substantially lower" or "substantially smaller" in relation to a first power value, such as an applied power, a limit power, a power threshold, a given power value, when being compared with a second power value, is meant that the first power value is lower than the second power value as is clear to the person skilled in the art of plasma generation at low pressure. More preferably, the first power value could thus be lower than the second power value at least by 0.1 W, yet more preferably by 0.2 W, still more preferably by 0.5 W, even more preferably by 1 W, yet even more preferably by 2 W, still even more preferably by 5 W, yet still more preferably by 10 W.

By the terms "stable plasma ignition", "stable ignition" or "stable plasma" as used herein, is meant that during normal operation a continuous minimal amount or flow of ionized molecules is present.

By the term 'time-average", "time-averaged" or "average in time" as used herein in relation to a quantity, is meant the average of that quantity over a specified time period, whereby the average is preferably computed by dividing the integrated quantity over that period by the length of that time period.

By the term "burst mode" as used herein, is meant a mode of applying power higher than a pre-determined upper burst threshold for a certain time after which the power is reduced to below a pre-determined lower burst threshold but continuously higher than or equal to a lower limit power, strictly higher than 0 W and preferably substantially higher than 0 W, for the rest of the process duration.

By the term "sinusoidal mode" as used herein, is meant a mode of applying power, wherein the power is sinusoidally varied between at least an upper limit power and at least a lower limit power, both substantially higher than 0 W, optionally whereby the amplitude of the sinusoidally varying power is modulated.

By the term "repeated burst mode" as used herein, is meant a mode of applying power wherein at least a lower limit power, strictly higher than 0 W, preferably substantially higher than 0 W, is continuously applied and wherein the power is increased to above a pre-determined upper or optionally intermediate burst threshold at repeated time intervals.

By the term "triangular mode" as used herein, is meant a mode of applying power, wherein the power is varied between at least an upper limit power, at least a lower limit power and optionally at least one intermediate limit power, all strictly, and preferably substantially, higher than 0 W, and wherein the power is varied in a linear rate.

In a preferred embodiment, the power input comprises at least one additional intermediate limit power, strictly larger, preferably substantially larger, than said lower limit power and strictly lower, preferably substantially lower, than said upper limit power.

In a preferred embodiment, the power input is continuously strictly higher than 0.1 W, preferably strictly higher than 0.2 W, more preferably strictly higher than 0.5 W, even more preferably strictly higher than 1 W, yet more preferably strictly higher than 2 W, still more preferably strictly higher than 5 W, most preferably strictly higher than 10 W during said treatment period.

In a preferred embodiment, the plasma comprises one or more monomers that can be polymerized by means of radical polymerization, condensation polymerization, addition polymerization, step-growth polymerization, or chain-growth polymerization, and optionally one or more carrier molecules, or a mixture thereof which comprises at least one monomer that can be polymerized.

In a preferred embodiment, the power is applied in burst mode, in sinusoidal mode, in repeated burst mode, such as repeated burst mode with square shape or rectangular shape, or in triangular mode, such as regular triangular mode or irregular triangular mode, or in superpositions thereof.

In a preferred embodiment, the lower limit power is 10 to 90% of the upper limit power, preferably wherein the lower limit power is 20 to 80% of the upper limit power.

In a preferred embodiment, the power is applied in burst mode, wherein an upper limit power, substantially higher than 0 W, is applied for a period of time, after which the power is switched to a lower limit power, substantially higher than 0 W, for the remaining duration of the treatment.

In a preferred embodiment, the power is applied in sinusoidal mode, wherein the power is sinusoidally varied between at least an upper limit power and at least a lower limit power, both substantially higher than 0 W, optionally whereby the amplitude of the sinusoidally varying power is modulated.

In a preferred embodiment, the power is applied in repeated burst mode, wherein at least a lower limit power, strictly substantially higher than 0 W, is continuously applied and wherein the power is increased to the upper limit power or to an intermediate power at repeated time intervals, wherein the intermediate power is 20 to 95%, preferably 30 to 80% of the upper limit power.

In a preferred embodiment, the power is varied in triangular mode between at least an upper limit power, at least a lower limit power and optionally at least one intermediate power, all substantially higher than 0 W, and wherein the power is varied in a linear rate, preferably wherein the intermediate power is 20 to 95%, more preferably 30 to 80% of the upper limit power.

In a preferred embodiment, the upper limit power is each time applied for a duration between 100 ms and 5000 ms, and/or the lower limit power is each time applied for a duration between 500 ms and 30000 ms, and/or the intermediate power is each time applied for a duration between 100 ms and 5000 ms.

In a preferred embodiment, a power sequence of changing between upper limit power and lower limit power is repeated continuously during the treatment period.

In a preferred embodiment, after application of the upper power limit and the lower power limit, a power sequence of changing between intermediate power and lower limit power is repeated continuously during the treatment period.

In a preferred embodiment, a power sequence of changing between upper limit power and lower limit power followed by x times changing between intermediate power and lower limit power is repeated continuously during the total plasma process time, whereby by x is at least 1, e.g. 1, 2, 3, 4, 5, 6, 7, 8, 9, 10 or more.

In a preferred embodiment, the power is applied in a superposition of at least two of the power modes comprising burst mode, repeated burst mode, sinusoidal mode and triangular mode.

In a preferred embodiment, the period lapsed between reaching the upper limit power two consecutive times is longer than 600 ms, preferably longer 1200 ms, and preferably shorter than 120 seconds, more preferably shorter than 90 seconds, yet more preferably shorter than 60 seconds. Optionally, the intermediate limit power is reached one or more times in between reaching the upper limit power two consecutive times.

In a preferred embodiment, the period lapsed between reaching an upper limit power and a consecutive intermediate limit power or between reaching the intermediate limit power two consecutive times is longer than 600 ms, and/or preferably shorter than 35 seconds.

In a preferred embodiment, the period lapsed between reaching the first upper limit power and reaching the second upper limit power, is longer than 600 ms, preferably longer 1200 ms, and preferably shorter than 120 seconds, more preferably shorter than 90 seconds, yet more preferably shorter than 60 seconds, even more preferably 35 seconds.

In a more preferred embodiment, a power sequence is repeated at least once every 120 seconds, preferably once every 90 seconds, more preferably once every 60 seconds, and/or the power sequence is repeated at most once every 600 ms, preferably at most once every 1200 ms.

In an embodiment of the methods of the present invention, the power input starts at the upper limit power or at the first or second upper limit power. In an alternative embodiment, the power input starts at the lower limit power. In yet an alternative embodiment, the power input starts at a power value between the upper limit power, the first upper limit power or the second upper limit power on the one hand, and the lower limit power on the other hand, such as at the intermediate limit power.

In an embodiment, the power input comprises a power value between said lower limit power and said upper limit power, said first upper limit power or said second upper limit power, said power value reached before said upper limit power or said first upper limit power is reached.

In a preferred embodiment, the substrate which is treated comprises polymers, metal, glass, ceramics, paper or composites comprising at least two materials which are selected from one or more of the foregoing list. For example, the substrate may comprise glass fiber or flax fiber reinforced plastics as used in automotive or a combination of conducting (e.g. metallic) and insulating (e.g. ceramic or polymeric) materials such as printed circuit boards. In a particularly preferred embodiment, said composite comprises at least two polymers such as flax-fiber reinforced polyamide or polymer-reinforced polymer, e.g. polypropylene-reinforced polypropylene.

Further embodiments are now being described with reference to the accompanying drawings.

Referring to FIG. 1, the power is applied as a continuous wave at a constant set continuous wave power value $P_c$, as indicated by the line 100. The average power is thus $P_c$, and is selected depending on the equipment design, the equipment size, and the monomer or monomers used.

Preferably, in a 490 l big plasma chamber, the applied continuous wave power $P_c$ is approximately 5 to 1000 W, more preferably approximately 5 to 500 W, even more preferably approximately, say 10 to 250 W, for example 15 to 200 W, say 20 to 150 W, such as 25 to 100 W, e.g. 100, 95, 90, 85, 80, 75, 70, 65, 60, 55, 50, 45, 40, 35, 30, or 25 W.

Figure 2:
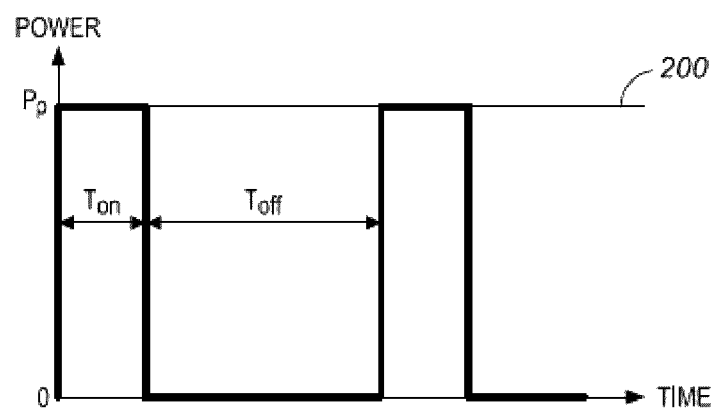
FIG. 2 shows a schematic illustration of a second power embodiment according to the prior art, in which the power is applied in pulsed mode (on-off)

Referring to FIG. 2, the power is applied in pulsed mode. In pulsed mode, the power of the process is bundled together in a peak power Pp, represented by the line 200, which is applied during an on-time Ton. During every other moment of the process, indicated as the off-time Toff, no power is applied. This means that after every on-time Ton, wherein a peak power Pp is applied, the power falls back to 0 W for a duration Toff. Next, the peak power Pp is applied again for a duration Ton. This sequence of on-off is repeated during for the total process duration. Typically the duration at which the peak power is applied, Ton, is short, while the Toff is typically longer.

The pulse repetition frequency is calculated by formula (I) and the duty cycle by formula (II):

$$\text{frequency} = \frac{1}{Ton + Toff} \quad (I)$$

$$\text{duty cycle} = \frac{Ton}{Ton + Toff} \quad (II)$$

The frequency and duty cycle, or the Ton and Toff, can be chosen so that a low average power Pavg is obtained according formula (III):

$$Pavg = Pp * \frac{Ton}{Ton + Toff} \quad (III)$$

The optimal frequency and duty cycle depend on the monomer precursor or monomer precursors used, and on the size and design of the low pressure plasma chamber, as described in several prior art documents, such as in:

Yasuda, H. en Hsu, T., Some Aspects of Plasma Polymerization Investigated by Pulsed R. F. Discharge, Journal of Polymer Science: Polymer Chemistry Edition, vol. 15, 81-97 (1977)

Yasuda, H., Hsu, T., Some Aspects of Plasma Polymerization of Fluorine-Containing Organic Compounds, Journal of Polymer Science: Polymer Chemistry Edition, vol. 15, 2411-2425 (1977)

Panchalingam V., Poon, Bryan, Hsiao-Hwei Huo, Savage, Charles R., Timmons, Richard B. en Eberhart Robert C., Molecular surface tailoring of biomaterials via pulsed RF plasma discharges, J. Biomater, Sci. Polymer Edn, Vol. 5, No. 1/2, 1993, 131-145

Panchalingam V., Chen, X., Huo, H-H., Savage, C. R., Timmons, R. B. en Eberhart R. C., Pulsed Plasma Discharge Polymer Coatings, ASAIO Journal, 1993, M305-M309

Hynes, A. M, Shenton, M. J. en Badyal, J. P. S., Plasma Polymerization of Trifluoromethyl-Substituted Perfluorocyclohexane Monomers, Macromolecules 1996, 29, 18-21

Hynes, A. M, Shenton, M. J. en Badyal, J. P. S., Pulsed Plasma Polymerization of Perfluorocyclohexane, Macromolecules 1996, 29, 4220-4225

Jenn-Hann Wang, Jin-Jian Chen en Timmons, Richard B., Plasma Synthesis of a Novel CF3-Dominated Fluorocarbon Film, Chem. Mater., 1996, 2212-2214

Jonhston, Erika E. en Ratner, Buddy D., Surface characterization of plasma deposited organic thin films, Journal of Electron Spectroscopy and Related Phenomena 81, 1996, 303-317

Limb, Scott J., Gleason, Karen K., Edell, David J. en Gleason, Edward F., Flexible fluorocarbon wire coatings by pulsed plasma enhanced chemical vapor deposition, J. Vac. Sci. Technol. A15(4), July/August 1997, 1814-1818

U.S. Pat. No. 5,876,753

Applicant found that when the power is applied in pulsed power mode, the pulse repetition frequency may be from 100 Hz to 10 kHz having a duty cycle from approximately 0.05 to 50, in order to obtain the best results in terms of functionality, such as hydrophobic and/or oleophobic or hydrophilic.

Preferably, when the power is applied in pulsed power mode in a 490 l big plasma chamber, the applied peak power Pp is approximately 5 to 5000 W, more preferably approximately 50 to 2500 W, even more preferably approximately, say 75 to 1500 W, for example 100 to 1000 W, for example 125 to 750 W, say 150 to 700 W, e.g. 700, 650, 600, 550, 500, 450, 400, 350, 300, 250, 200, 175, or 150 W.

Referring to FIGS. 3A to 3D, a first inventive continuous power mode embodiment is described in a mode which Applicant refers to as the "burst mode". The power is applied in a continuous mode during which an initial upper limit power Pb is applied, indicated resp. by the lines 300, 310, 320, and 330. After a certain period of time Tb, which is determined by the system and the monomer or monomers used, optionally combined with one or more carrier molecules, the initial upper limit power Pb is reduced to reach a second lower limit power value Pf substantially higher than 0 W, which is then continuously applied to maintain the plasma ignition, indicated resp. by the lines 301, 311, 321, and 331.

Preferably, when applied in a 490 l big plasma chamber, the upper limit power Pb is approximately 5 to 5000 W, more preferably approximately 20 to 2500 W, even more preferably approximately, say 25 to 1500 W, for example 30 to 1000 W, for example 40 to 750 W, say 50 to 700 W, e.g. 700, 650, 600, 550, 500, 450, 400, 350, 300, 250, 200, 175, 150, 125, 100, 95, 90, 85, 80, 75, 70, 65, 60, 55, or 50 W.

Preferably, the lower limit power is approximately 10 to 90% of the upper limit power, more preferably 20 to 80% of the upper limit power, for example 80, 75, 70, 65, 60, 55, 50, 45, 40, 35, 30, 25, or 20%.

Preferably, when applied in a 490 l big plasma chamber, the lower limit power Pf is approximately 5 to 1000 W, more preferably approximately 5 to 500 W, even more preferably approximately, say 10 to 250 W, for example 15 to 200 W, say 20 to 150 W, such as 25 to 100 W, e.g. 100, 95, 90, 85, 80, 75, 70, 65, 60, 55, 50, 45, 40, 35, 30, or 25 W.

For example, when the upper limit power is 100 W and the lower limit power value is 30% of this upper limit power, the lower limit power is set at 30 W.

For example, when the upper limit power is 80 W and the lower limit power value is 50% of this upper limit power, the lower limit power is set at 40 W.

Figure 3A:
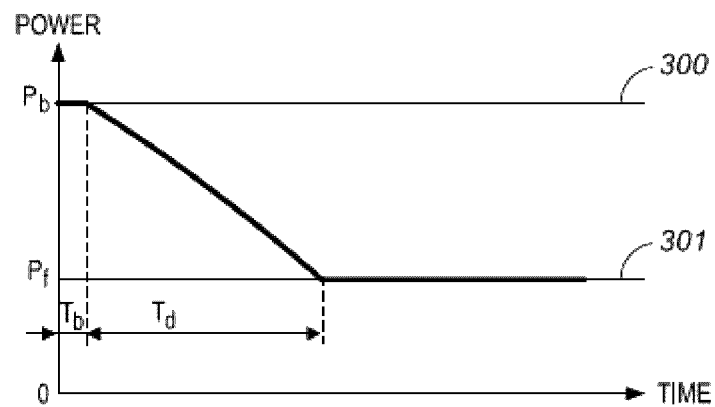
FIGS. 3-7 show schematic illustrations of continuous power mode embodiments according to the present invention, which will be described further in detail.
Figure 3B:
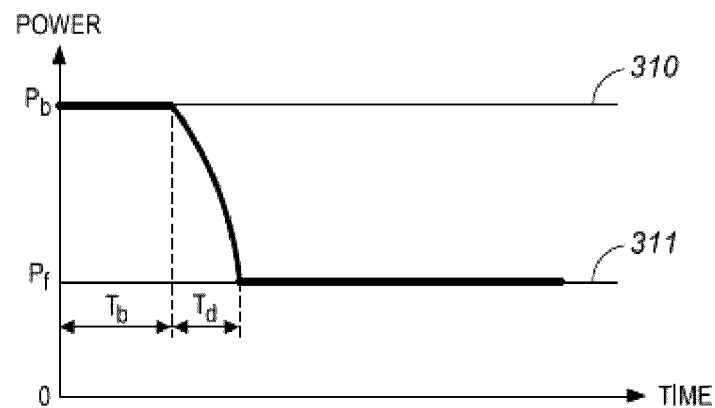
Figure 3C:
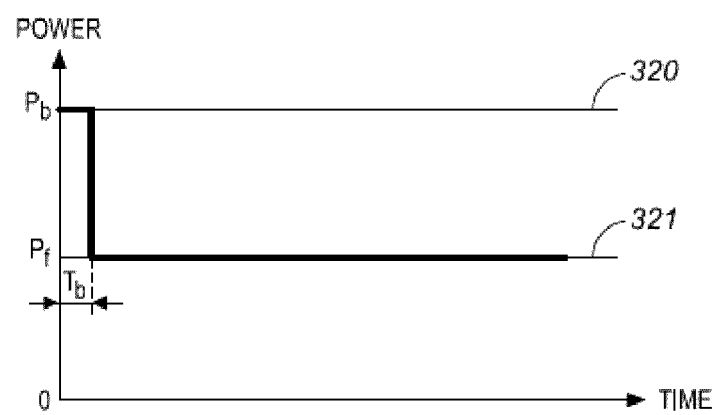
Figure 3D:
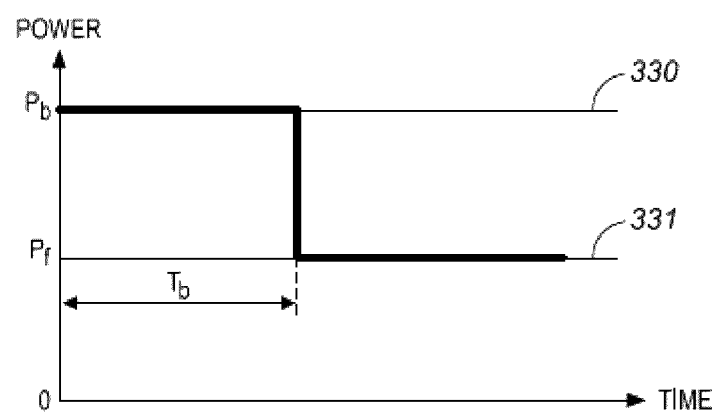

The decrease in power value from Pb to Pf is executed over a time Td. In the schematic illustrations of FIGS. 3A and 3B, Td is substantially higher than 0 s. However, in some cases it might be preferred that Td is very close to 0 s, as can be seen in FIGS. 3C and 3D.

The optimal values for Pb, Pf, Tb and Td are dependent on the monomer precursor or precursors used, and on the size and design of the low pressure plasma equipment.

The duration Tb during which the upper limit power value Pb is applied, is dependent on the monomer or monomers used, optionally combined with one or more carrier molecules, and on the electrode configuration used, and is preferably between 200 ms and 30000 ms, more preferably between 250 ms and 25000 ms, even more preferably between 500 ms and 20000 ms, for example between 1000 ms and 10000 ms, such as 10000, 9500, 9000, 8500, 8000, 7500, 7000, 6500, 6000, 5500, 5000, 4500, 4000, 3500, 3000, 2500, 2000, 1900, 1800, 1700, 1600, 1500, 1400, 1300, 1200, 1100, or 1000 ms.

Preferably, the duration Td during which the power is lowered from Pb to Pf is between 1 μs and 5000 ms, more preferably between 1 μs and 2500 ms. In a preferred embodiment, said duration Td is kept as small as possible, preferably smaller than 500 μs, more preferably smaller than 200 μs, even more preferably smaller than 100 μs, yet more preferably smaller than 50 μs, still more preferably smaller than 20 μs, still even more preferably smaller than 10 μs, yet even more preferably smaller than 5 μs, e.g. as illustrated by FIGS. 3C-3D. In another preferred embodiment, said duration Td is larger than 50 ms, preferably larger than 100 ms, more preferably larger than 200 ms, even more preferably larger than 500 ms, still more preferably larger than 1000 ms.

By defining the right power values, a low average power combined with improved plasma ignition and plasma stability is obtained. This clearly benefits the resulting coating uniformity and quality.

Figure 4A:
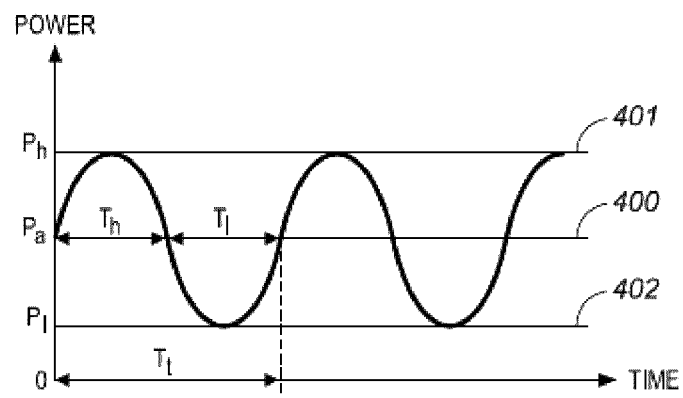

FIG. 4A shows a schematic representation of a second inventive continuous power mode embodiment wherein the power is applied in a sinusoidal way with a period Tt. At the start of the process, the applied power is the average power value Pa, which is then increased to a maximum power value Ph.

The power is varied continuously during the process, but never falls back to 0 W, hence this is considered as a continuous power mode substantially different from pulsed plasma mode. The power varies around an average power value Pa substantially higher than 0 W, and is half the time of the period Tt, duration Th (Th is ½ of Tt), higher than the average power value Pa with a maximum power value Ph, and is half the time of the period Tt, duration Tl (Tl is ½ of Tt and equals Th), lower than the average power value Pa with a minimum power value Pl which is substantially higher than 0 W. The power is varied continuously around the average power Pa, and reaches its maximum after ¼ of the period Tt and reaches its minimum after ¾ of the period Tt. This power variation in function of time within one period is repeated continuously during the total duration of the low pressure plasma process. The power difference in absolute values between Ph and Pa is the amplitude of the sinusoidal power mode, and equals the power difference in absolute values between Pl and Pa.

Preferably, the average power Pa is more than 50% of the maximum power Ph so that the minimum power Pl is substantially higher than 0 W in order to maintain the plasma ignited. The minimum power Pl is calculated with the formulae IV and V, given the values of Pa and Ph are known—Pa can be calculated based on the value of Ph and a percentage z of more than 50%:

$$Pl = Pa - (Ph - Pa) \quad \text{(IV)}$$

or $$Pl = (2*z - 1)*Ph \quad \text{(V)}$$

For example, with a maximum power of 500 W and an average power which is 60% of the maximum power (z=0.6), the average power is 300 W and the minimum power is 100 W.

Figure 4B:
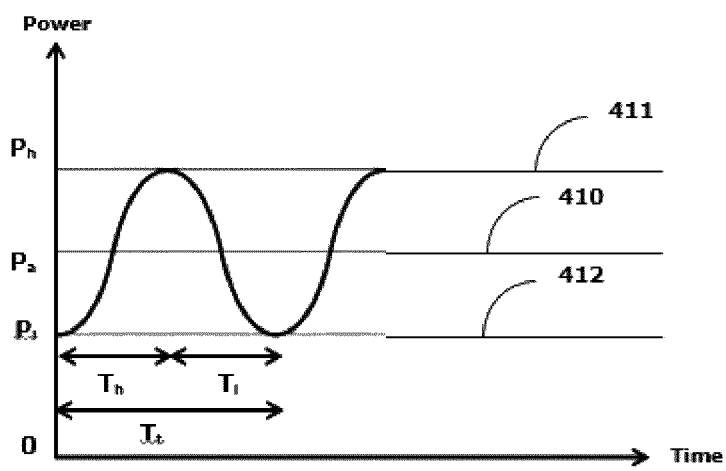

FIG. 4B shows another schematic representation of this second inventive continuous power mode embodiment wherein the power is applied in a sinusoidal way with a period Tt. At the start of the process, the applied power is a minimum power value Pl, which is then increased to an average power value Pa and further to a maximum power value Ph.

Preferably, when applied in a 490 l big plasma chamber, the maximum power Ph is approximately 5 to 5000 W, more preferably approximately 10 to 2500 W, even more preferably approximately, say 25 to 1500 W, for example 50 to 1000 W, for example 75 to 750 W, say 100 to 700 W, e.g. 700, 650, 600, 550, 500, 450, 400, 350, 300, 250, 200, 190, 180, 175, 170, 160, 150, 140, 130, 125, 120, 110, or 100 W.

Figure 5A:
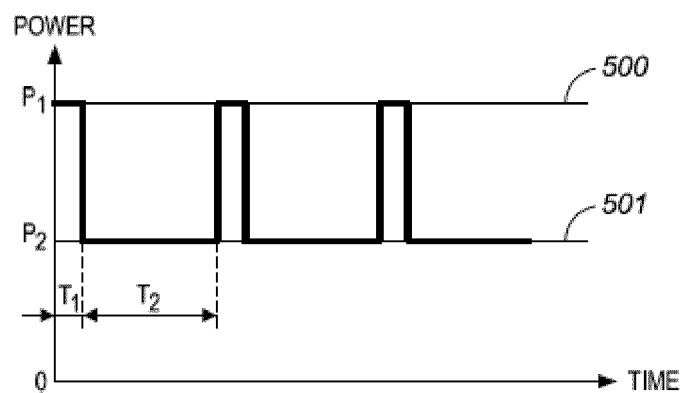
Figure 5B:
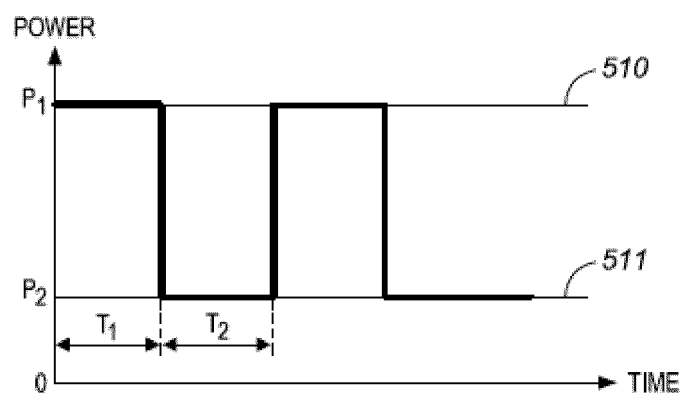

Referring to FIGS. 5A to 5D, a third inventive continuous power mode embodiment is described in a mode which Applicant refers to as the "repeated burst mode". The applied power is varied in a repetitive sequence between at least an upper limit power P1 (indicated resp. by lines 500, 510, 520, and 530) and at least a lower limit power P2 (indicated resp. by lines 501, 511, 521, and 531), both substantially higher than 0 W (FIGS. 5A and 5B). Eventually, an intermediate power value P3 may be applied as well for a period of time (FIGS. 5C and 5D, indicated resp. by lines 522 and 532). As P1 and P2 are substantially higher than 0 W, P3 will be substantially higher than 0 W as well.

Figure 5C:
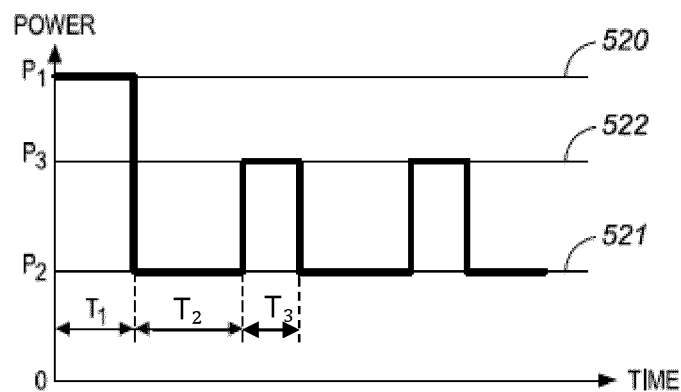
Figure 5D:
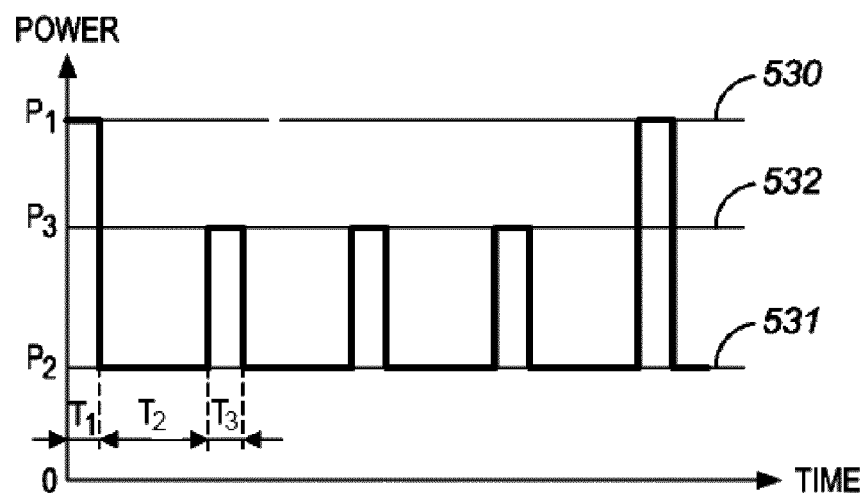
Figure 5E:
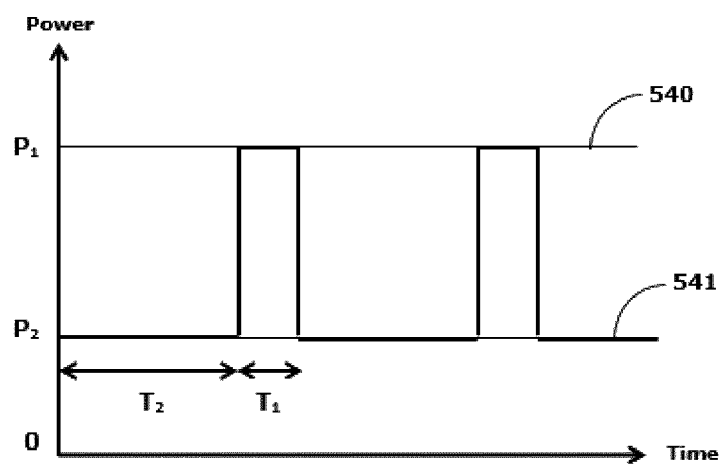

FIGS. 5E to 5H represent further embodiments of the "repeated burst mode", wherein the power value applied at the beginning of the process is a lower limit power P2 (indicated resp. by lines 541, 551, 561, and 571). The applied power is varied in a repetitive sequence between at least an upper limit power P1 (indicated resp. by lines 540, 550, 560, and 570) and at least a lower limit power P2 (indicated resp. by lines 541, 551, 561, and 571), both substantially higher than 0 W (FIG. 5E). Eventually, an intermediate power value P3 may be applied as well for a period of time (FIGS. 5F, 5G and 5H, indicated resp. by lines 552, 562 and 572). Since P1 and P2 are substantially higher than 0 W, P3 will be substantially higher than 0 W as well.

With respect to FIGS. 5A and 5B, upper limit power P1 is applied at the beginning of the low pressure plasma treatment for a duration T1. After T1, the power is lowered to a lower limit power P2, substantially higher than 0 W. P2 is applied for a duration T2. After this, the power value is increased back to the upper limit power P1, which is again maintained for a duration T1. Then the power is decreased to the lower limit power value P2, which is again maintained for a duration T2. This repetitive sequence, in which the power P2 is stoked up at regular time intervals to upper limit power value P1, is continued for the total duration of the plasma process, hence the name "repeated burst mode".

In the case where duration T1 and duration T2 are equal, the "repeated burst mode" reflects a square wave function. In the cases where duration T1 is smaller than duration T2, the "repeated burst mode" reflects a rectangular wave function.

The power sequence can be schematically summarized as (P1→P2)n, with n calculated according to the following formula:

$$n = \frac{\text{total process time}}{T1 + T2} \quad \text{(VI)}$$

With respect to FIG. 5E, lower limit power P2, substantially higher than 0 W, is applied at the beginning of the low pressure plasma treatment for a duration T2. After T2, the power is increased to an upper limit power P1, substantially higher than 0 W. P1 is applied for a duration T1. After this, the power value is decreased back to the lower limit power P2, which is again maintained for a duration T2. Then the power is increased to the upper limit power value P1, which is again maintained for a duration T1. This repetitive sequence, in which the power P2 is stoked up at regular time intervals to upper limit power value P1, is continued for the total duration of the plasma process, hence the name "repeated burst mode".

In the case where duration T1 and duration T2 are equal, the "repeated burst mode" reflects a square wave function. In the cases where duration T1 is smaller than duration T2, the "repeated burst mode" reflects a rectangular wave function.

The power sequence can be schematically summarized as (P2→P1)n, with n calculated according to formula (VI).

With respect to FIGS. 5A, 5B and 5E, the applicants have surprisingly discovered that in certain embodiments it is not necessary to apply the upper limit power value right from the start, but that plasma ignition and a stable plasma may be obtained as well by applying initially a lower limit power value P2, which is increased to P1 after a time T2, as long as the power P2 is stoked up at regular time intervals to upper limit power value P1. Whether the "repeated burst" is carried out according to FIGS. 5A and 5B, or according to FIG. 5E, depends on the low pressure plasma equipment used, on the monomers used, and on the substrates to be coated.

With respect to FIG. 5C, upper limit power P1 is applied at the beginning of the low pressure plasma treatment for a duration T1. After T1, the power is lowered to a lower limit power P2, substantially higher than 0 W. P2 is applied for a duration T2. After this, the power value is increased to an intermediate power value P3, substantially higher than 0 W, which is maintained for a duration T3. Then the power is decreased back to the lower limit power value P2, which is again maintained for a duration T2. Then the power is increased back to P3 for a duration T3. This repetitive sequence, in which the power P2 is stoked up at regular time intervals to an intermediate value P3, is then continued for the total duration of the plasma process, hence the name "repeated burst mode".

In the case where durations T1, T2 and T3 are equal, the "repeated burst mode" reflects a square wave function. In the cases where not all three of durations T1, T2 and T3 are equal, for example durations T1 and T2 are equal and are smaller than duration T3, the "repeated burst mode" reflects a rectangular wave function.

The power sequence can be schematically summarized as P1→(P2→P3)m, with m calculated according to the following formula:

$$m = \frac{\text{total process time} - T1}{T2 + T3} \quad \text{(VIII)}$$

Figure 5F:
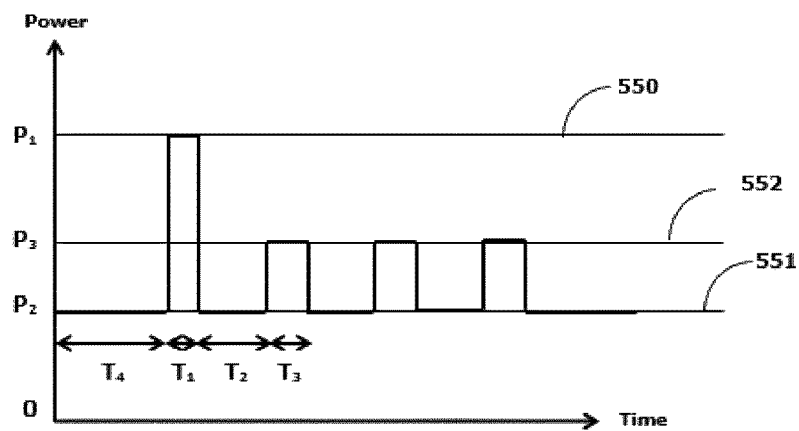

With respect to FIG. 5F, lower limit power P2, substantially higher than 0 W, is applied at the beginning of the low pressure plasma treatment for a duration T4. After T4, the power is increased (or stoked up) to an upper limit power P1. P1 is applied for a duration T1. After this, the power value is decreased back to the lower limit power value P2 for a duration T2, after which the power is increased (or stoked up) to an intermediate power value P3, substantially higher than 0 W, which is maintained for a duration T3. Next, the power is decreased back to the lower limit power value P2, which is again maintained for a duration T2. Then the power is switched between P3 (for a duration of T3) and P2 (for a duration of T2) for the remaining time of the total plasma process duration, hence the name "repeated burst mode".

In the case where durations T1, T2, T3 and T4 are equal, the "repeated burst mode" reflects a square wave function. In the cases where not all four of durations T1, T2, T3 and T4 are equal, for example durations T1 and T3 are equal and are smaller than durations T2 and T4, the "repeated burst mode" reflects a rectangular wave function.

The power sequence can be schematically summarized as P2→P1→(P2→P3)b, with b calculated according to the following formula:

$$b = \frac{\text{total process time} - T1 - T4}{T2 + T3} \quad \text{(XVIII)}$$

With respect to FIG. 5D, upper limit power P1 is applied at the beginning of the low pressure plasma treatment for a duration T1. After T1, the power is lowered to a lower limit power P2, substantially higher than 0 W. P2 is applied for a duration T2. After this, the power value is increased (or stoked up) to an intermediate power value P3, substantially higher than 0 W, which is maintained for a duration T3. Next, the power is decreased back to the lower limit power value P2, which is again maintained for a duration T2. Then the power is switched between P3 (for a duration of T3) and P2 (for a duration of T2) for a certain number of times, noted as x. For example x is from 0 to 9. FIG. 5D gives a schematic illustration for x equal to 2.

This repetitive sequence P1-P2-P3-P2-(P3-P2)x, with x from 0 to 9, is considered as one "repeated burst cycle". This "repeated burst cycle" is now repeated during the total duration of the low pressure plasma process, hence the name "repeated burst mode". The number of "repeated burst cycles", y, can be calculated according to the following formula:

$$y = \frac{\text{total process time}}{T1 + (x+2)*T2 + (x+1)*T3} \quad \text{(VIII)}$$

In the case where durations T1, T2 and T3 are equal, the "repeated burst mode" reflects a square wave function. In the cases where not all three of durations T1, T2 and T3 are equal, for example durations T1 and T2 are equal and are smaller than duration T3, the "repeated burst mode" reflects a rectangular wave function.

The "repeated burst mode" can be seen as a continuous power mode at a lower (limit) power (substantially higher than 0 W) in which the plasma is stoked up repeatedly to reach at least an upper limit power and optionally at least one intermediate limit power, which is done to maintain the plasma ignited. This embodiment differs distinctively from the pulsed mode in that the power never falls back to 0 W during the process.

Figure 5G:
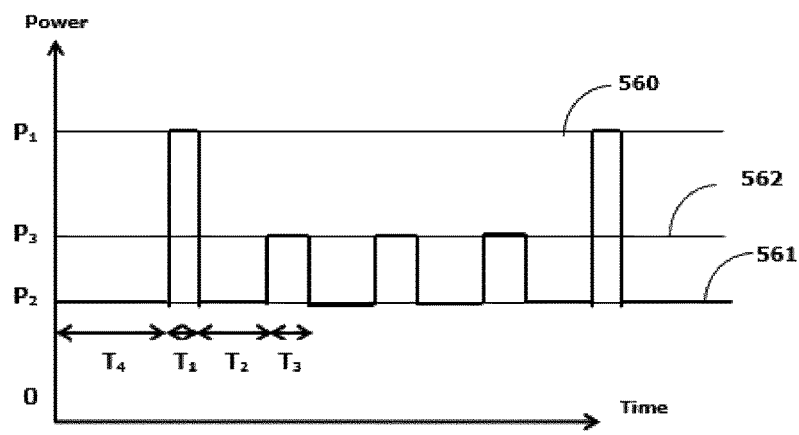

With respect to FIG. 5G, lower limit power P2, substantially higher than 0 W, is applied at the beginning of the low pressure plasma treatment for a duration T4. After T4, the power is increased (or stoked up) to an upper limit power P1. P1 is applied for a duration T1. After this, the power value is decreased back to the lower limit power value P2 for a duration T2, after which the power is increased (or stoked up) to an intermediate power value P3, substantially higher than 0 W, which is maintained for a duration T3. Next, the power is decreased back to the lower limit power value P2, which is again maintained for a duration T2. Then the power is switched between P3 (for a duration of T3) and P2 (for a duration of T2) for a certain number of times, noted as β. For example β is from 0 to 9. FIG. 5G gives a schematic illustration for β equal to 2.

The repetitive sequence P1-P2-(P3-P2)(β+1), with β from 0 to 9, is considered as one "repeated burst cycle". This "repeated burst cycle" is now repeated during the total duration of the low pressure plasma process, hence the name "repeated burst mode". The number of "repeated burst cycles", γ, can be calculated according to the following formula:

$$\gamma = \frac{\text{total process time} - T4}{T1 + (\beta+2)*T2 + (\beta+1)*T3} \quad \text{(XIX)}$$

The total sequence can be written as P2-[P1-P2-(P3-P2)(β+1)]γ.

In the case where durations T1, T2, T3 and T4 are equal, the "repeated burst mode" reflects a square wave function. In the cases where not all four of durations T1, T2, T3 and T4 are equal, for example durations T1 and T3 are equal and are smaller than durations T2 and T4, the "repeated burst mode" reflects a rectangular wave function.

Figure 5H:
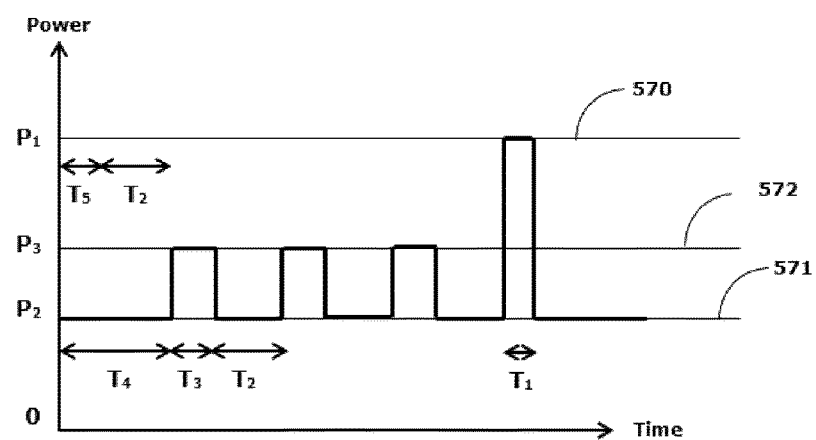

With respect to FIG. 5H, lower limit power P2, substantially higher than 0 W, is applied at the beginning of the low pressure plasma treatment for a duration T4, which equals T5+T2. After T4, the power is increased (or stoked up) to an intermediate limit power P3. P3 is applied for a duration T3. After this, the power value is decreased back to the lower limit power value P2 for a duration T2, after which the power is increased (or stoked up) again to P3, substantially higher than 0 W, which is maintained for a duration T3. Next, the power is decreased back to the lower limit power value P2, which is again maintained for a duration T2. The power is switched between P3 (for a duration of T3) and P2 (for a duration of T2) for a certain number of times, noted as θ. For example θ is from 0 to 9. FIG. 5H gives a schematic illustration for θ equal to 3. After θ times the (P3-P2) sequence, the power is increased (stoked up) to an upper limit power value P1, which is applied for a duration T1. Afterwards, the power is decreased back to P2 for a duration T2 after which θ times the (P3-P2) sequence is applied again.

The repetitive sequence P2–(P3–P2)θ–P1, with θ from 0 to 9, is considered as one "repeated burst cycle". This "repeated burst cycle" is now repeated during the total duration of the low pressure plasma process, hence the name "repeated burst mode". The number of "repeated burst cycles", φ, can be calculated according to the following formula:

$$\varphi = \frac{\text{total process time} - T5}{T1 + (\theta + 1) * T2 + \theta * T3} \quad (XX)$$

The total sequence can be written as P2–[P2–(P3–P2)θ–P1]φ.

In the case where durations T1, T2, T3 and T4 are equal, the "repeated burst mode" reflects a square wave function. In the cases where not all four of durations T1, T2, T3 and T4 are equal, for example durations T1 and T3 are equal and are smaller than durations T2 and T4, the "repeated burst mode" reflects a rectangular wave function. When T4 equals T2, then T5 is zero.

The "repeated burst mode" can be seen as a continuous power mode at a lower (limit) power (substantially higher than 0 W) in which the plasma is stoked up repeatedly to reach at least an upper limit power and optionally at least one intermediate limit power, which is done to maintain the plasma ignited. This embodiment differs distinctively from the pulsed mode in that the power never falls back to 0 W during the process.

Applicant discovered surprisingly that this inventive continuous power mode embodiment of stoking up the plasma at regular time intervals, as described above with support from FIGS. 5A to 5D, improves further the plasma ignition and stability of the plasma during coating, because the plasma remains well ignited.

Further, Applicant discovered surprisingly that this inventive continuous power mode embodiment of stoking up the plasma at regular time intervals, does not need to start with the upper limit power value P1 applied, but that good plasma ignition and a stable plasma may be obtained as well by applying a lower limit power value as initial power value, as described above with support from FIGS. 5E to 5F, since the stoking up of the plasma is the main factor in maintaining the plasma ignition and obtaining a stable plasma throughout the total duration of the low pressure plasma process.

The time intervals T1, T2 and eventually T3, as well as the power values P1, P2 and eventually P3 are determined by the system and the monomer or monomers used, optionally combined with one or more carrier molecules.

The time intervals T4 and eventually T5 from FIGS. 5F to 5H, are determined by the system and the monomer or monomers used, optionally with one or more carrier molecules.

Preferably, when applied in a 490 l big plasma chamber, the upper limit power P1 is approximately 5 to 5000 W, more preferably approximately 10 to 2500 W, even more preferably approximately, say 25 to 1500 W, for example 50 to 1000 W, for example 75 to 750 W, say 150 to 700 W, e.g. 700, 650, 600, 550, 500, 450, 400, 350, 300, 250, 200, 190, 180, 175, 170, 160, 150, 140, 130, 125, 120, 110, 100, 95, 90, 85, 80, or 75 W.

Preferably, the lower limit power P2 is approximately 10 to 90% of the upper limit power P1, more preferably 20 to 80% of the upper power limit, for example 80, 75, 70, 65, 60, 55, 50, 45, 40, 35, 30, 25, or 20%.

Preferably, when applied in a 490 l big plasma chamber, the lower limit power P2, is approximately 5 to 1000 W, more preferably approximately 5 to 500 W, even more preferably approximately, say 10 to 250 W, for example 15 to 200 W, say 20 to 150 W, such as 25 to 100 W, e.g. 100, 95, 90, 85, 80, 75, 70, 65, 60, 55, 50, 45, 40, 35, 30, or 25 W.

Preferably, the intermediate power P3 is approximately 20 to 95% of the upper limit power P1, more preferably 30 to 80% of the upper power limit, for example 80, 75, 70, 65, 60, 55, 50, 45, 40, 35, or 30%. For all embodiments, the intermediate power value P3 is always higher than the lower power value P2.

Preferably, when applied in a 490 l big plasma chamber, the lower limit power P3, is approximately 5 to 1000 W, more preferably approximately 10 to 500 W, even more preferably approximately, say 15 to 250 W, for example 20 to 200 W, say 25 to 150 W, such as 50 to 100 W, e.g. 100, 95, 90, 85, 80, 75, 70, 65, 60, 55, or 50 W.

For example, when the upper limit power P1 is 500 W and the lower limit power P2 is 10% of this P1, then P2 is set at 50 W.

For example, when the upper limit power P1 is 100 W and the lower limit power P2 is 30% of this P1, and the intermediate power P3 is 50% of this P1, then P2 is set at 30 W and P3 is set at 50 W.

Preferably T1 is between 100 ms and 5000 ms, more preferably between 200 ms and 4000 ms, even more preferably between 500 ms and 2500 ms, for example 2500, 2400, 2300, 2250, 2200, 2100, 2000, 1900, 1800, 1750, 1700, 1600, 1500, 1400, 1300, 1250, 1200, 1100, 1000, 950, 900, 850, 800, 750, 700, 650, 600, 550, or 500 ms.

The repeated burst mode is particularly preferred as the applicant has found that it is better than continuous wave mode with regards to oil repellency treatments and to igniting and stabilizing the plasma, while it is also better than pulsed mode with regards to deposition rate.

It is found surprisingly that the repeated burst mode is also better than the regular "burst" mode in terms of deposition rate and stable ignition of the plasma throughout the total low pressure plasma duration, especially in chambers of small volume.

Preferably T2 is between 500 ms and 30000 ms, more preferably between 750 ms and 20000 ms, even more preferably between 1000 ms and 15000 ms, for example 15000, 14500, 14000, 13500, 13000, 12500, 12000, 11500, 11000, 10500, 10000, 9750, 9500, 9250, 9000, 8750, 8500, 8250, 8000, 7750, 7500, 7250, 7000, 6750, 6500, 6250, 6000, 5750, 5500, 5250, 5000, 4750, 4500, 4250, 4000, 3750, 3500, 3250, 3000, 2750, 2500, 2250, 2000, 1900, 1800, 1750, 1700, 1600, 1500, 1400, 1300, 1250, 1200, 1100, or 1000 ms.

Preferably T3 is between 100 ms and 5000 ms, more preferably between 200 ms and 4000 ms, even more preferably between 500 ms and 2500 ms, for example 2500, 2400, 2300, 2250, 2200, 2100, 2000, 1900, 1800, 1750, 1700, 1600, 1500, 1400, 1300, 1250, 1200, 1100, 1000, 950, 900, 850, 800, 750, 700, 650, 600, 550, or 500 ms.

Preferably T4 is between 500 ms and 30000 ms, more preferably between 750 ms and 20000 ms, even more preferably between 1000 ms and 15000 ms, for example 15000, 14500, 14000, 13500, 13000, 12500, 12000, 11500, 11000, 10500, 10000, 9750, 9500, 9250, 9000, 8750, 8500, 8250, 8000, 7750, 7500, 7250, 7000, 6750, 6500, 6250, 6000, 5750, 5500, 5250, 5000, 4750, 4500, 4250, 4000, 3750, 3500, 3250, 3000, 2750, 2500, 2250, 2000, 1900, 1800, 1750, 1700, 1600, 1500, 1400, 1300, 1250, 1200, 1100, or 1000 ms.

Preferably T5 is between 500 ms and 30000 ms, more preferably between 750 ms and 20000 ms, even more preferably between 1000 ms and 15000 ms, for example 15000, 14500, 14000, 13500, 13000, 12500, 12000, 11500, 11000, 10500, 10000, 9750, 9500, 9250, 9000, 8750, 8500, 8250, 8000, 7750, 7500, 7250, 7000, 6750, 6500, 6250, 6000, 5750, 5500, 5250, 5000, 4750, 4500, 4250, 4000, 3750, 3500, 3250, 3000, 2750, 2500, 2250, 2000, 1900, 1800, 1750, 1700, 1600, 1500, 1400, 1300, 1250, 1200, 1100, or 1000 ms.

Figure 6A:
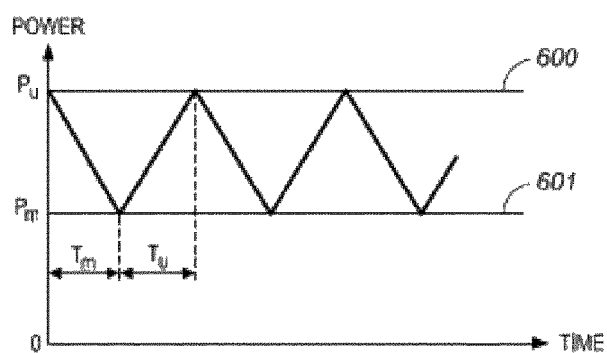
Figure 6B:
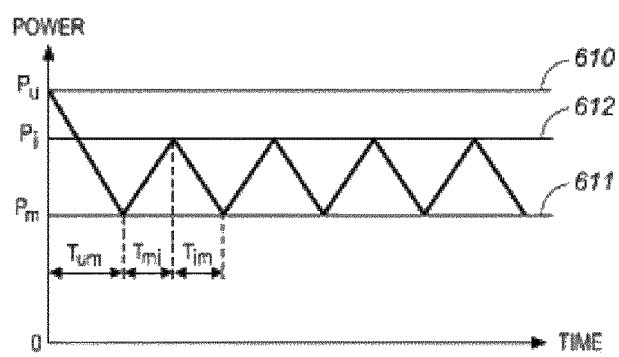
Figure 6C:
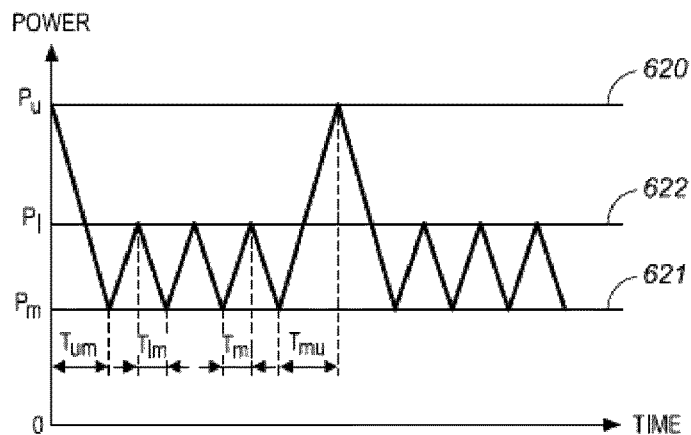

FIGS. 6A to 6C shows schematic representations of a fourth inventive continuous power mode embodiment wherein the power is applied in a triangular way. The power is varied continuously during the total plasma process duration and is always equal to or higher than the minimum power Pm, which is substantially higher than 0 W.

Referring to FIG. 6A, at the beginning of the process the applied power is an upper limit power value Pu, substantially higher than 0 W, as indicated by line 600. This upper limit power Pu is then decreased to a lower limit power value Pm, substantially higher than 0 W, as indicated by line 601. Next, the power is again increased up to the upper limit power value Pu, and decreased back to the lower limit power value Pm. This sequence of power increase and power decrease is repeated continuously for the total duration of the low pressure plasma process. The duration wherein the power is decreased from Pu to Pm is indicated by Tm. The duration wherein the power is increased from Pm to Pu is indicated by Tu. The increase and decrease rate of the power is linear, i.e. the power is increased and decreased at a constant rate, and the slope of the lines in FIG. 6A can be calculated according to the following formulae:

$$\text{Increase rate} = \frac{(Pu - Pm)}{Tu} \quad \text{(IX)}$$

$$\text{Decrease rate} = \frac{(Pu - Pm)}{Tm} \quad \text{(X)}$$

In case duration Tm and duration Tu are equal, the triangular mode is a regular triangular mode. In case duration Tm is not equal to duration Tu, the triangular mode is an irregular triangular mode.

Figure 6D:
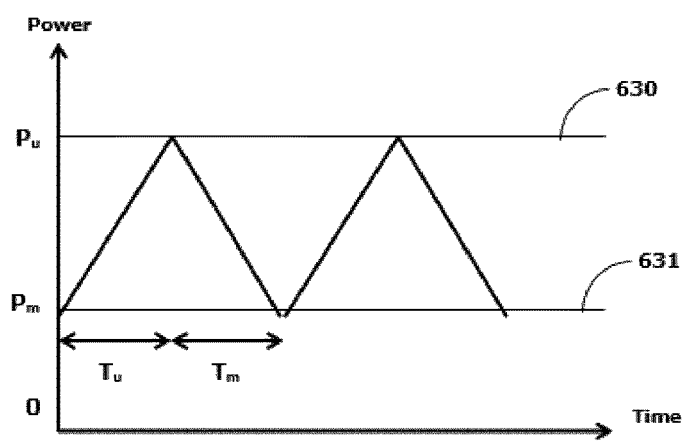

Referring to FIG. 6D, at the beginning of the process the applied power is a lower limit power value Pm, substantially higher than 0 W, as indicated by line 631. This lower limit power Pm is then increased to an upper limit power value Pu, substantially higher than 0 W, as indicated by line 630. Next, the power is again decreased up to the lower limit power value Pm, and increased back to the upper limit power value Pu. This sequence of power increase and power decrease is repeated continuously for the total duration of the low pressure plasma process. The duration wherein the power is decreased from Pu to Pm is indicated by Tm. The duration wherein the power is increased from Pm to Pu is indicated by Tu. The increase and decrease rate of the power is linear, i.e. the power is increased and decreased at a constant rate, and the slope of the lines in FIG. 6D can be calculated according to the formulae (IX) and (X).

In case duration Tm and duration Tu are equal, the triangular mode is a regular triangular mode. In case duration Tm is not equal to duration Tu, the triangular mode is an irregular triangular mode.

With respect to FIGS. 6A and 6D, the applicants have surprisingly discovered that in certain embodiments it is not necessary to apply the upper limit power value Pu right from the start, but that plasma ignition and a stable plasma may be obtained as well by applying initially a lower limit power value Pm, which is increased to Pu during a time Tu, as long as the power Pm is increased at regular time intervals to upper limit power value Pu. Whether the "triangular mode" is carried out according to FIG. 6A or according to FIG. 6D, depends on the low pressure plasma equipment used, on the monomers used, and on the substrates to be coated.

With respect to FIG. 6B, an upper limit power Pu, substantially higher than 0 W as indicated by line 610, is applied at the beginning of the low pressure plasma treatment. This upper limit power Pu is then decreased to a lower limit power value Pm, substantially higher than 0 W, as indicated by line 611. Next, the power is increased up an intermediate power value Pi, as indicated by line 612, substantially higher than 0 W, and is then decreased back to the lower limit power value Pm. Then, the power is increased again up to the intermediate power value Pi and decreased again to the lower limit power Pm. This sequence of power increase and decrease between Pm and Pi is then continued for the total duration of the plasma process.

The duration wherein the power is decreased from Pu to Pm is indicated by Tum. The duration wherein the power is decreased from Pi to Pm is indicated by Tim. The duration wherein the power is increased from Pm to Pi is indicated by Tmi. The increase and decrease rate of the power is linear, i.e. the power is increased and decreased at a constant rate, and the slope of the lines in FIG. 6B can be calculated according to the following formulae:

$$\text{Increase rate}(Pm \text{ to } Pi) = \frac{Pi - Pm}{Tmi} \quad \text{(XI)}$$

$$\text{Decrease rate}(Pu \text{ to } Pm) = \frac{Pu - Pm}{Tum} \quad \text{(XII)}$$

$$\text{Decrease rate}(Pi \text{ to } Pm) = \frac{Pi - Pm}{Tim} \quad \text{(XIII)}$$

Figure 6E:
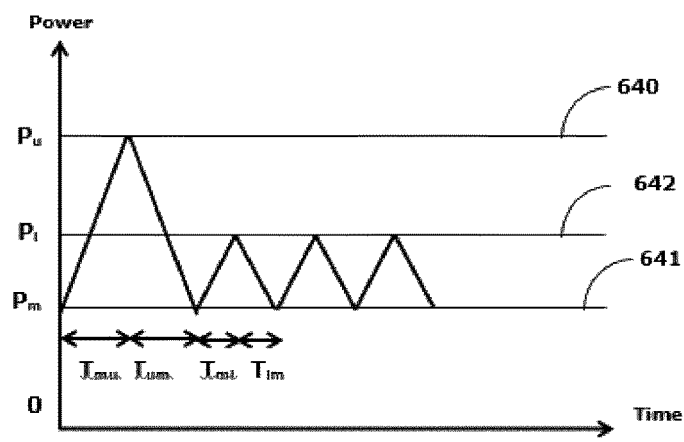

With respect to FIG. 6E, a lower limit power Pm, substantially higher than 0 W as indicated by line 641, is applied at the beginning of the low pressure plasma treatment. This lower limit power Pm is then increased to an upper limit power value Pu, substantially higher than 0 W, as indicated by line 640. Next, the power is decreased back to Pm and is then increased up to an intermediate power value Pi, as indicated by line 642, substantially higher than 0 W, and is then decreased back to the lower limit power value Pm. Then, the power is increased again up to the intermediate power value Pi and decreased again to the lower limit power Pm. This sequence of power increase and decrease between Pm and Pi is then continued for the total duration of the plasma process.

The duration wherein the power is increased from Pm to Pu is indicated by Tmu. The duration wherein the power is decreased from Pu to Pm is indicated by Tum. The duration wherein the power is decreased from Pi to Pm is indicated by Tim. The duration wherein the power is increased from Pm to Pi is indicated by Tmi. The increase and decrease rate of the power is linear, i.e. the power is increased and decreased at a constant rate, and the slope of the lines in FIG. 6E can be calculated according to the formulae (XI), (XII), (XIII) and (XXI):

$$\text{Increase rate}(Pm \text{ to } Pu) = \frac{Pu - Pm}{Tmu} \quad \text{(XXI)}$$

The overall repetitive sequence may be written as Pm–Pu–Pm–(Pi–Pm)ψ, with ψ according to formula (XXII):

$$\psi = \frac{\text{Total time} - Tmu - Tum}{Tmi + Tim} \quad \text{(XXII)}$$

With respect to FIG. 6C, an upper limit power Pu, substantially higher than 0 W as indicated by line 620, is applied at the beginning of the low pressure plasma treatment. This upper limit power Pu is then decreased to a lower limit power value Pm, substantially higher than 0 W, as indicated by line 621. Next, the power is increased up an intermediate power value Pi, as indicated by line 622, substantially higher than 0 W, and is then decreased back to the lower limit power value Pm. Then the power is switched between Pm and Pi for a certain number of times, noted as q. For example q is from 0 to 9. FIG. 6C gives a schematic illustration of q equal to 2.

This overall repetitive sequence Pu–Pm–Pi–Pm–(Pi–Pm)q, with q from 0 to 9, is considered as one "triangular mode cycle". This "triangular mode cycle" is now repeated during the total duration of the low pressure plasma process.

The duration wherein the power is decreased from Pu to Pm is indicated by Tum. The duration wherein the power is decreased from Pi to Pm is indicated by Tim. The duration wherein the power is increased from Pm to Pi is indicated by Tmi. The duration wherein the power is increased from Pm to Pu is indicated by Tmu. The increase and decrease rate of the power is linear, i.e. the power is increased and decreased at a constant rate, and the slope of the lines in FIG. 6C can be calculated according to the following formulae:

$$\text{Increase rate}(Pm \text{ to } Pi) = \frac{Pi - Pm}{Tmi} \quad \text{(XIV)}$$

$$\text{Increase rate}(Pm \text{ to } Pu) = \frac{Pu - Pm}{Tmu} \quad \text{(XV)}$$

$$\text{Decrease rate}(Pu \text{ to } Pm) = \frac{Pu - Pm}{Tum} \quad \text{(XVI)}$$

$$\text{Decrease rate}(Pi \text{ to } Pm) = \frac{Pi - Pm}{Tim} \quad \text{(XVII)}$$

Figure 6F:
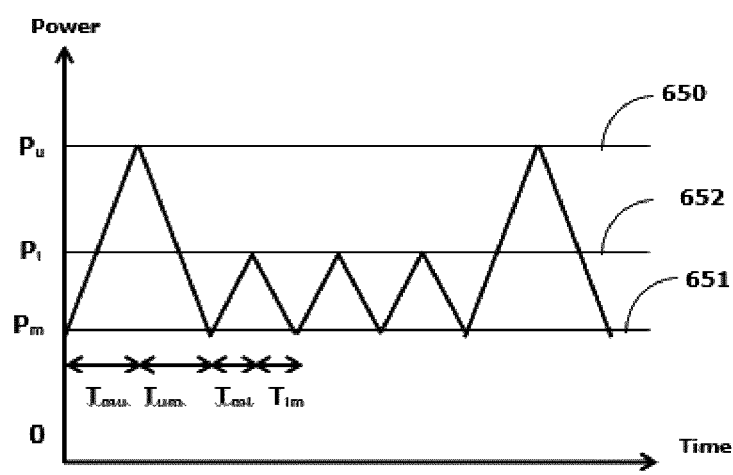

With respect to FIG. 6F, an lower limit power Pm, substantially higher than 0 W as indicated by line 651, is applied at the beginning of the low pressure plasma treatment. This lower limit power Pm is then increased to an upper limit power value Pu, substantially higher than 0 W, as indicated by line 650. Next, the power is decreased back to the lower limit power value Pm. Next, the power is increased up an intermediate power value Pi, as indicated by line 652, substantially higher than 0 W, and is then decreased back to the lower limit power value Pm. Then the power is switched between Pm and Pi for a certain number of times, noted as λ. For example λ is from 0 to 9. FIG. 6F gives a schematic illustration of λ equal to 2.

The duration wherein the power is decreased from Pu to Pm is indicated by Tum. The duration wherein the power is decreased from Pi to Pm is indicated by Tim. The duration wherein the power is increased from Pm to Pi is indicated by Tmi. The duration wherein the power is increased from Pm to Pu is indicated by Tmu. The increase and decrease rate of the power is linear, i.e. the power is increased and decreased at a constant rate, and the slope of the lines in FIG. 6F can be calculated according to the formulae (XIV), (XV), (XVI), and (XVII):

This overall repetitive sequence Pm–Pu–Pm–(Pi–Pm)(λ+1), with λ from 0 to 9, is considered as one "triangular mode cycle". This "triangular mode cycle" is now repeated during the total duration of the low pressure plasma process. The number of "triangular mode cycles", ψ, can be calculated according to the following formula:

$$\psi = \frac{\text{Total time}}{Tmu + Tum + (\lambda + 1) * (Tmi + Tim)} \quad \text{(XXIII)}$$

Figure 6G:
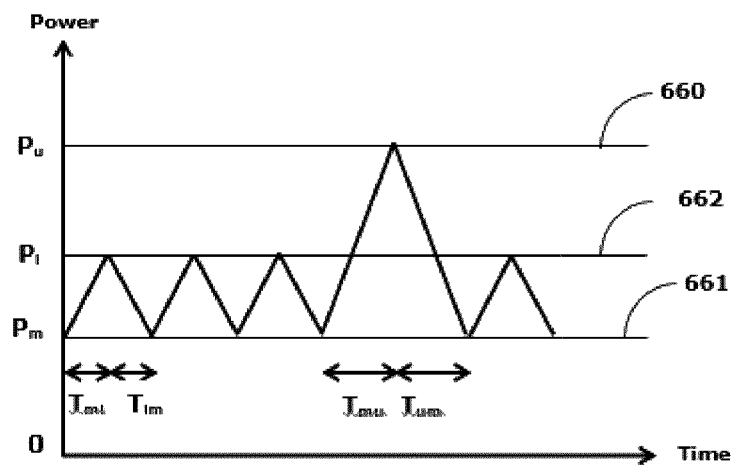

With respect to FIG. 6G, an lower limit power Pm, substantially higher than 0 W as indicated by line 661, is applied at the beginning of the low pressure plasma treatment. This lower limit power Pm is then increased to an intermediate limit power value Pi, substantially higher than 0 W, as indicated by line 662. Next, the power is decreased back to the lower limit power value Pm. Next, the power is further switched between Pm and Pi for a certain number of times, noted as λ. For example λ is from 0 to 9. FIG. 6G gives a schematic illustration of λ equal to 2. Next, the power is increased up to the upper limit power value Pu and decreased back to the lower limit power value Pm, after which the complete sequence is repeated up to the end of the low pressure plasma process duration.

The duration wherein the power is decreased from Pu to Pm is indicated by Tum. The duration wherein the power is decreased from Pi to Pm is indicated by Tim. The duration wherein the power is increased from Pm to Pi is indicated by Tmi. The duration wherein the power is increased from Pm to Pu is indicated by Tmu. The increase and decrease rate of the power is linear, i.e. the power is increased and decreased at a constant rate, and the slope of the lines in FIG. 6G can be calculated according to the formulae (XIV), (XV), (XVI), and (XVII):

This overall repetitive sequence (Pm–Pi)(λ+1)–Pm–Pu–Pm, with λ from 0 to 9, is considered as one "triangular mode cycle". This "triangular mode cycle" is now repeated during the total duration of the low pressure plasma process. The number of "triangular mode cycles", ψ, can be calculated according to formula (XXIII).

Applicant discovered surprisingly that this inventive continuous power mode embodiment, as described above with support from FIGS. 6A to 6C, improves further the plasma ignition and stability of the plasma during coating, because the plasma remains well ignited.

With respect to FIGS. 6B, 6C, 6E to 6G, the applicants have surprisingly discovered that in certain embodiments it is not necessary to apply the upper limit power value Pu right from the start, but that plasma ignition and a stable plasma may be obtained as well by applying initially a lower limit power value Pm, which is increased to Pu during a time Tu, as long as the power Pm is increased at regular time intervals to upper limit power value Pu. Whether the "triangular mode" is carried out according to FIG. 6B or 6C, or according to FIGS. 6E to 6G, depends on the low pressure plasma equipment used, on the monomers used, and on the substrates to be coated.

The durations Tm, Tu and eventually Tum, Tmu, Tim, and Tmi, as well as the power values Pu, Pm and eventually Pi are determined by the system and the monomer or monomers used, optionally combined with one or more carrier molecules.

Preferably, when applied in a 490 l big plasma chamber, the upper limit power Pu is approximately 5 to 5000 W, more preferably approximately 10 to 2500 W, even more preferably approximately, say 25 to 1500 W, for example 50 to 1000 W, for example 75 to 750 W, say 150 to 700 W, e.g. 700, 650, 600, 550, 500, 450, 400, 350, 300, 250, 200, 190, 180, 175, 170, 160, 150, 140, 130, 125, 120, 110, 100, 95, 90, 85, 80, or 75 W.

Preferably, the lower limit power Pm is approximately 10 to 90% of the upper limit power Pu, more preferably 20 to 80% of the upper power limit, for example 80, 75, 70, 65, 60, 55, 50, 45, 40, 35, 30, 25, or 20%.

Preferably, when applied in a 490 l big plasma chamber, the lower limit power Pm, is approximately 5 to 1000 W, more preferably approximately 5 to 500 W, even more preferably approximately, say 10 to 250 W, for example 15 to 200 W, say 20 to 150 W, such as 25 to 100 W, e.g. 100, 95, 90, 85, 80, 75, 70, 65, 60, 55, 50, 45, 40, 35, 30, or 25 W.

Preferably, the intermediate power Pi is approximately 20 to 95% of the upper limit power Pu, more preferably 30 to 80% of the upper power limit, for example 80, 75, 70, 65, 60, 55, 50, 45, 40, 35, or 30%. For all embodiments, the intermediate power value Pi is always higher than the lower power value Pm.

Preferably, when applied in a 490 l big plasma chamber, the lower limit power Pi, is approximately 5 to 1000 W, more preferably approximately 10 to 500 W, even more preferably approximately, say 15 to 250 W, for example 20 to 200 W, say 25 to 150 W, such as 50 to 100 W, e.g. 100, 95, 90, 85, 80, 75, 70, 65, 60, 55, or 50 W.

For example, when the upper limit power Pu is 500 W and the lower limit power Pm is 10% of this Pu, then Pm is set at 50 W.

For example, when the upper limit power Pu is 100 W and the lower limit power Pm is 30% of this Pu, and the intermediate power Pi is 50% of this Pu, then Pm is set at 30 W and Pi is set at 50 W.

Preferably Tm, Tu, Tum, Tmu, Tim, and Tmi are between 100 ms and 30000 ms, more preferably between 200 ms and 20000 ms, even more preferably between 500 ms and 15000 ms, such as 1000 ms and 10000 ms, for example 10000, 9750, 9500, 9250, 9000, 8750, 8500, 8250, 8000, 7750, 7500, 7250, 7000, 6750, 6500, 6250, 6000, 5750, 5550, 5250, 5000, 4750, 4500, 4250, 4000, 3750, 3500, 3250, 3000, 2750, 2500, 2250, 2000, 1900, 1800, 1750, 1700, 1600, 1500, 1400, 1300, 1250, 1200, 1100, or 1000 ms.

Figure 7:
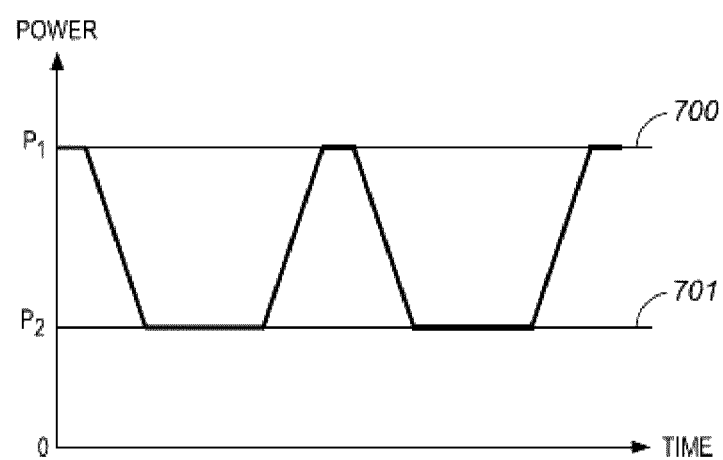

Applicant further discovered that combinations or superimposed configurations of the foregoing inventive continuous power mode embodiments may have further advantages for some equipments and chemistries used. FIG. 7 shows an example wherein the "repeated burst mode" of FIG. 5A is combined with the triangular mode of FIG. 6A. Other combinations are as well possible, and the best configuration can be found by using routine techniques to evaluate the resulting coating quality and to optimize the processing parameters.

All individual continuous mode embodiments have at every moment during the low pressure plasma process a power value substantially higher than 0 W. Hence, all combinations or superimposed configurations have also power values that are substantially higher than 0 W at every moment during the low pressure plasma process.

Preferably, the radiofrequency electrode or electrodes generate a high frequency electric field at frequencies of from 20 kHz to 2.45 GHz, more preferably of from 40 kHz to 13.56 MHz, with 13.56 MHz being preferred.

EXAMPLES

In order that the invention may be more readily understood, it will now be described by way of the following non-limiting examples.

Example 1

Applicant discovered in a laboratory set-up that the mode in which the power is applied depends on the monomer and the equipment used. This is especially the case for acrylates and methacrylates used in low pressure plasma coating processes to render substrates water and/or oil repellent. Applicant has found that perfluoro(meth)acrylates containing maximum 6 carbon atoms in the perfluorocarbon chain result in polymer coatings having significantly better oil repellency levels when deposited in continuous power mode, herein including continuous wave at constant power and the inventive continuous power modes "burst mode", "repeated burst mode", sinusoidal mode or triangular mode, or any superposed configurations thereof, rather than in pulsed wave.

On the other hand, perfluoro(meth)acrylates containing 8 carbon atoms in the perfluorocarbon chain result in polymer coatings having similar oil repellency levels when deposited in continuous power mode, herein including continuous wave at constant power and the inventive continuous power modes "burst mode", "repeated burst mode", sinusoidal mode or triangular mode, or any superposed configurations thereof, and pulsed wave, although the pulsed wave, the "burst mode", "repeated burst mode", sinusoidal mode or triangular mode, or any superposed configurations thereof tend to have a slightly better performance, for example in terms of coating thickness.

In this example, three monomers are deposited in continuous wave plasma at constant power ("Cw") and in pulsed wave plasma ("Pulsed"), as presented in Table 1. The test was carried out in our laboratory set-up on a polypropylene nonwoven and the performance was evaluated using the oil repellency test according to ISO 14419.

For the monomer containing 8 carbon atoms in the perfluorocarbon chain, the coating deposited in pulsed wave plasma reaches an oil repellency that is equal or a little higher than the coating deposited with continuous wave plasma.

For both the acrylate and methacryl containing 6 carbon atoms in the perfluorocarbon chain, the coating deposited with continuous wave plasma performs significantly better than the coating deposited in pulsed wave plasma.

With continuous wave plasma oil repellence level 6 according to ISO 14419 is obtained at low power, e.g. at 100 W in our 490 l big laboratory plasma chamber, and in short treatment times, e.g. 2 minutes. It is disadvantageous to use high power, e.g. 350 W, 500 W, 1000 W or even more because the monomer precursor will fragment, leading to poor coatings, e.g. having no uniformity.

TABLE 1

Shows the oil repellency levels for continuous wave and pulsed wave processes

| Monomer | $C_{13}H_7O_2F_{17}$ | | $C_{11}H_7O_2F_{13}$ | | $C_{12}H_9O_2F_{13}$ | |
|---|---|---|---|---|---|---|
| Monomer classification | C8 acrylate | | C6 acrylate | | C6 methacrylate | |
| Deposition mode | Pulsed | Cw | Pulsed | Cw | Pulsed | Cw |
| Treatment time (min) | 5 min | 5 min | 5 min | 5 min | 5 min | 5 min |
| Oil repellency | 8 | 7 | 4 | 6 | 3 | 6 |

Example 2: Power Mode

As explained above, it is known that for complex monomers that the average power has to be low enough to prevent fragmentation of the functional group of the monomer precursor. For smaller machines, e.g. with a chamber volume below 1000 l, prior art methods such as the continuous wave plasma are not always sufficient for the continuous ignition of the plasma, because the requested low average power may be too low to maintain with commercially available generators and may prevent a good and stable ignition of the plasma.

For larger machines, e.g. with a chamber volume of 1000 l and more, the requested low average power is somewhat higher than for the smaller machines, because of the chamber design and electrode design. For these large machines, it is in most but not all cases possible to maintain the requested average power with the commercially available generators.

TABLE 2

Shows the oil repellency levels for different continuous mode and pulsed wave processes in chambers with different volume. The ranges of the constant power of the continuous wave modes which were tested, are also given.

| | | Continuous power mode | | |
|---|---|---|---|---|
| Chamber volume | Pulsed | Continuous wave (constant power) | "Burst" | "Repeated burst" |
| 50 l | 8 | 6-7 (10-75 W) | 8 | 8 |
| 89 l | 8 | 6-7 (20-100 W) | 8 | 8 |
| 490 l | 8 | 7 (30-150 W) | 8 | 8 |
| 3000 l | 8 | 8 (100-500 W) | 8 | 8 |

Table 2 shows the results of lab-testing done on three smaller machines, with respective volume of 50 l, 89 l and 490 l, and on one bigger machine with a volume of 3000 l. A monomer with 8 carbon atoms in a perfluorocarbon chain is deposited in these machines on PP non-woven, in different power modes as described above. Evaluation of the coating is done by determination of the oil repellency level according to ISO14419.

From Table 2 it is clear that for chambers of small size the coatings deposited with continuous wave plasma applied at a constant low power value give an oil repellency lower than the coatings deposited with pulsed plasma, due to unstable plasma ignition because of the fact that the requested constant power is too low to be generated in a stable way by commercial available generators. But when the continuous power mode is applied in the "burst" mode or the "repeated burst" mode, the same oil repellency of the pulsed plasma coatings can be obtained, and the plasma ignition is largely improved. The oil repellency coming from the "burst" mode and the "repeated burst" mode also prove that the complex precursor monomers are not fragmented during plasma processing.

For the coatings deposited in the large volume chamber, there is no difference noticed in the coatings deposited with pulsed plasma and the three continuous power modes. It is clear from Table 2 that the continuous wave plasma applied at a constant power has now the same oil repellency as the pulsed plasma process, because the requested average power is high enough to be maintained in a stable way by the commercial available generators.

Applicant also discovered surprisingly that the "burst" mode, the "repeated burst" mode, the triangular mode and the sinusoidal mode or any superposed configurations thereof not only allow better plasma ignition with improved oil repellency compared to continuous wave mode, but also have a deposition rate which is higher than the pulsed mode and in the range of coatings deposited with continuous wave mode. This leads to thicker coatings in the same coating time, as can be understood from Table 3. The experiments are carried out in a chamber of 1000 l volume for varying coating times. Thickness measurements are carried out on a Si-plate which was placed at the same position for every process.

TABLE 3

Shows the coating thickness for different continuous mode and pulsed wave processes in a 490 l chamber, performed at six different coating durations

| | | Continuous power mode | |
|---|---|---|---|
| Coating time | Pulsed | Continuous wave (constant power) | "Repeated burst" |
| 1 min | 15-20 nm | 30-40 nm | 25-35 nm |
| 2.5 min | 25-30 nm | 60-70 nm | 55-65 nm |
| 5 min | 55-65 nm | 105-115 nm | 90-110 nm |
| 10 min | 110-125 nm | 145-165 nm | 145-160 nm |
| 15 min | 170-190 nm | 190-210 nm | 230-250 nm |
| 20 min | 240-260 nm | 260-280 nm | 290-310 nm |

Example 3: Power Mode

In order to study the difference between "burst mode" and "repeated burst mode", and the influence of the initially applied upper limit power value, the applicants have performed 3 processes in a 490 l chamber to investigate the impact on the coating thickness. The total process duration was 20 minutes.

The "burst mode" was carried out according to FIG. 3C, with Pb set at 80 W, Pf at 30 W and Tb 1000 ms.

The "repeated burst mode" was carried out with 2 processes.

Process 1 was performed according to FIG. 5A, with P1 equal to 80 W, P2 equal to 30 W, and T1 equal to 1000 ms and T2 equal to 10 000 ms. The upper limit power value of 80 W was thus applied at the beginning of the process.

Process 2 was performed according to FIG. 5E, with P1 equal to 80 W, P2 equal to 30 W, and T1 equal to 1000 ms and T2 equal to 10 000 ms. The lower limit power value of 30 W was thus applied at the beginning of the process.

The thickness values of the processes are listed in Table 4.

TABLE 4

Shows the coating thickness for different continuous mode processes in a 490 l chamber

| Coating time | Continuous power mode | | |
|---|---|---|---|
| | "Burst" | "Repeated burst" Process 1 | "Repeated burst" Process 2 |
| 20 min | 250-270 nm | 290-310 nm | 280-300 nm |

It is clear from Table 4 that the repeated burst processes give a higher thickness, up to more than 10% thicker, than the burst process, for the same upper limit power value (80 W), the same lower limit power value (30 W) and the same process time.

From Table 4 it is also clear that there is no significant influence in resulting coating thickness for process 1 and process 2, hence in this situation one may choose for starting the process at the lower limit power value.

The invention claimed is:

1. Coating method comprising the steps of:
introducing a substrate comprising a surface to be coated in a low-pressure reaction chamber,
exposing said surface to a plasma comprising one or more monomers 5 that can be polymerized during a treatment period within said reaction chamber,
applying a power input,
wherein the power input is continuously strictly higher than zero Watt (W) during said treatment period and whereby said power input reaches a first upper limit power, a lower limit power after said first upper limit power and a second upper limit power after said lower limit power, said first and said second upper limit power strictly larger than said lower limit power, thereby ensuring a stable plasma ignition to obtain a substrate with a plasma coated surface.

2. Coating method according to claim 1, whereby the monomers can be polymerized by means of radical polymerization, condensation polymerization, addition polymerization, step-growth polymerization, or chain-growth polymerization, and optionally one or more carrier molecules, or a mixture thereof which comprises at least one monomer that can be polymerized.

3. Coating method according to claim 1, wherein a monomer precursor is used during the step of exposing the surface to the plasma, such that an oil repellent coating is obtained.

4. Coating method according to claim 1, wherein the first upper limit power and the second upper limit power are substantially different from each other, preferably wherein said first and second upper limit power are higher than said lower limit power by at least 1 Watt and/or by at least 20% of said lower limit power.

5. Coating method according to claim 1, wherein the power is applied in sinusoidal mode, in repeated burst mode, such as repeated burst mode with square shape or rectangular shape, or in triangular mode, or in superpositions thereof, wherein the period lapsed between reaching the first upper limit power and reaching the second upper limit power, is longer than 600 ms and shorter than 120 seconds.

6. Coating method comprising the steps of:
introducing a substrate comprising a surface to be coated in a low-pressure reaction chamber,
exposing said surface to a plasma comprising one or more monomers that can be polymerized during a treatment period within said reaction chamber,
applying a power input,
wherein the power input is continuously strictly higher than zero Watt (W) during said treatment period and comprises at least a lower limit power and at least an upper limit power strictly larger than said lower limit power, and in that a power sequence of changing between upper limit power and lower limit power is repeated during the treatment period, thereby ensuring a stable plasma ignition to obtain a substrate with a plasma coated surface.

7. Coating method according to claim 6, whereby the monomers can be polymerized by means of radical polymerization, condensation polymerization, addition polymerization, step-growth polymerization, or chain-growth polymerization, and optionally one or more carrier molecules, or a mixture thereof which comprises at least one monomer that can be polymerized.

8. Coating method according to claim 6, wherein a monomer precursor is used during the step of exposing the surface to the plasma, such that an oil repellent coating is obtained.

9. Coating method according to claim 6, whereby said power sequence of changing between upper limit power and lower limit power is repeated continuously during the treatment period.

10. Coating method according to claim 6, wherein the power is applied in sinusoidal mode, in repeated burst mode, such as repeated burst mode with square shape or rectangular shape, or in triangular mode, or in superpositions thereof.

11. Coating method according to claim 6, wherein said upper limit power is higher than said lower limit power by at least 1 Watt and/or by at least 20% of said lower limit power.

12. Coating method according to claim 6, wherein said power input comprises at least one additional intermediate limit power, strictly larger than said lower limit power, preferably wherein said intermediate limit power is strictly larger than said lower limit power by at least 1 Watt and/or by at least 20% of said lower limit power and/or wherein said intermediate limit power is strictly lower than said upper limit power, said intermediate power being 20% to 95% of said upper limit power, more preferably wherein after application of the upper limit power and the lower limit power, a power sequence of changing between intermediate power and lower limit power is repeated, preferably continuously, during the treatment period.

13. Coating method according to claim 6, wherein the period lapsed between reaching the upper limit power two consecutive times is longer than 600 ms and shorter than 120 seconds and/or wherein the period lapsed between reaching an upper limit power and a consecutive intermediate limit power or between reaching the intermediate limit power two consecutive times is longer than 600 ms and shorter than 35 seconds.

* * * * *

UNITED STATES PATENT AND TRADEMARK OFFICE
CERTIFICATE OF CORRECTION

PATENT NO. : 10,410,833 B2  
APPLICATION NO. : 15/027708  
DATED : September 10, 2019  
INVENTOR(S) : Filip Legein et al.

Page 1 of 1

It is certified that error appears in the above-identified patent and that said Letters Patent is hereby corrected as shown below:

On the Title Page

Item (30), Foreign Application Priority Data, change "Jul. 10, 2013" to --Oct. 7, 2013--.

Signed and Sealed this  
First Day of December, 2020

Andrei Iancu  
*Director of the United States Patent and Trademark Office*